United States Patent
Jung et al.

(10) Patent No.: US 9,786,675 B2
(45) Date of Patent: Oct. 10, 2017

(54) NON-VOLATILE MEMORY DEVICES INCLUDING CHARGE STORAGE LAYERS

(71) Applicant: SAMSUNG ELECTRONICS CO., LTD., Suwon-si, Gyeonggi-Do (KR)

(72) Inventors: Jaehun Jung, Seoul (KR); Zhiliang Xia, Hwaseong-si (KR); Daewoong Kang, Seoul (KR); Dae Sin Kim, Hwaseong-si (KR); Kwang Soo Seol, Seongnam-si (KR); Homin Son, Seoul (KR); Seunghyun Lim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/043,640

(22) Filed: Feb. 15, 2016

(65) Prior Publication Data

US 2016/0240550 A1    Aug. 18, 2016

(30) Foreign Application Priority Data

Feb. 16, 2015    (KR) .................. 10-2015-0023351

(51) Int. Cl.
| | |
|---|---|
| *H01L 29/788* | (2006.01) |
| *H01L 27/11568* | (2017.01) |
| *H01L 29/423* | (2006.01) |
| *H01L 29/792* | (2006.01) |

(52) U.S. Cl.
CPC .... *H01L 27/11568* (2013.01); *H01L 29/4234* (2013.01); *H01L 29/792* (2013.01)

(58) Field of Classification Search
CPC ......... H01L 21/28282; H01L 27/11563; H01L 29/792
USPC ........................................ 257/321, 322, 324
See application file for complete search history.

(56) References Cited

U.S. PATENT DOCUMENTS

| | | | |
|---|---|---|---|
| 6,753,572 B2 * | 6/2004 | Lee .................. | H01L 21/28282 257/324 |
| 7,772,072 B2 | 8/2010 | Wang et al. | |
| 7,898,850 B2 | 3/2011 | Min et al. | |
| 8,314,457 B2 | 11/2012 | Kim et al. | |
| 8,426,907 B2 | 4/2013 | Park et al. | |
| 8,431,984 B2 | 4/2013 | Park et al. | |
| 8,816,424 B2 | 8/2014 | Lee et al. | |
| 8,872,254 B2 | 10/2014 | Lee et al. | |

(Continued)

FOREIGN PATENT DOCUMENTS

KR    20110118961 A    11/2011

*Primary Examiner* — Tan N Tran
(74) *Attorney, Agent, or Firm* — Volentine & Whitt, PLLC

(57) ABSTRACT

A non-volatile memory device includes gate electrodes stacked on a substrate, a semiconductor pattern penetrating the gate electrodes and connected to the substrate, and a charge storage layer between the semiconductor pattern and the gate electrodes. The charge storage layer includes a first charge storage layer between the semiconductor pattern and the gate electrodes, a second charge storage layer between the first charge storage layer and the semiconductor pattern, and a third charge storage layer between the first charge storage layer and the gate electrodes. An energy band gap of the first charge storage layer is smaller than those of the second and third charge storage layers. The first charge storage layer is thicker than the second and third charge storage layers.

19 Claims, 35 Drawing Sheets

(56) References Cited

U.S. PATENT DOCUMENTS 8,885,404 B2 11/2014 Dutta et al.
2008/0093661 A1 4/2008 Joo et al.

* cited by examiner

NON-VOLATILE MEMORY DEVICES INCLUDING CHARGE STORAGE LAYERS

CROSS-REFERENCE TO RELATED APPLICATION

A claim of priority under 35 U.S.C. §119 is made to Korean Patent Application No. 10-2015-0023351, filed on Feb. 16, 2015, in the Korean Intellectual Property Office, the disclosure of which is hereby incorporated by reference in its entirety.

BACKGROUND

The inventive concepts relate to a non-volatile memory device. More particularly, the inventive concepts relate to a non-volatile memory device including charge storage layers.

A non-volatile memory device is an electrically erasable programmable memory device and retains stored data even when a supply of power thereto is interrupted. Depending on the type of memory storage layer utilized, certain non-volatile memory devices may be categorized as floating gate-type non-volatile memory devices or charge trap-type non-volatile memory devices. Among these, charge trap-type non-volatile memory devices especially are the subject of continued development in view of their relatively low power consumption, low operating voltage and high integration characteristics.

The charge trap-type non-volatile memory device may include a charge trapping layer used for storing charges, a charge tunneling layer, and a charge blocking layer. The charge tunneling layer and the charge blocking layer may be disposed under and over the charge trapping layer, respectively. Charges may be selectively stored in the charge trapping layer according energy band gap differences among these layers.

SUMMARY

In one aspect, a non-volatile memory device may include a plurality of gate electrodes stacked on a substrate in a first direction perpendicular to a top surface of the substrate, a semiconductor pattern penetrating the gate electrodes and connected to the substrate, and a charge storage layer between the semiconductor pattern and the gate electrodes. The charge storage layer may include first, second and third charge storage layers. The first charge storage layer may be disposed between the semiconductor pattern and the gate electrodes, and may have a first energy band gap. The second charge storage layer may be disposed between the first charge storage layer and the semiconductor pattern, and may have a second energy band gap. The third charge storage layer may be disposed between the first charge storage layer and the gate electrodes, and may have a third energy band gap. The first energy band gap may be smaller than the second and third energy band gaps. The first, second, and third charge storage layers may have a first thickness, a second thickness, and a third thickness, respectively, in a second direction parallel to the top surface of the substrate. The first thickness may be greater than the second thickness and the third thickness.

In an embodiment, the non-volatile memory device may further include a tunnel insulating layer between the semiconductor pattern and the charge storage layer, and a blocking insulating layer between the charge storage layer and the gate electrodes. The first, second, and third energy band gaps may be smaller than energy band gaps of the tunnel insulating layer and the blocking insulating layer.

In an embodiment, a nitrogen concentration in the first charge storage layer may be higher than a nitrogen concentration in the second charge storage layer and a nitrogen concentration in the third charge storage layer.

In an embodiment, an oxygen concentration in the first charge storage layer may be lower than an oxygen concentration in the second charge storage layer and an oxygen concentration in the third charge storage layer.

In an embodiment, the charge storage layer may further include a fourth charge storage layer disposed between the second charge storage layer and the tunnel insulating layer. The fourth charge storage layer may have a fourth energy band gap, and the fourth energy band gap may be smaller than the second energy band gap.

In an embodiment, the fourth charge storage layer may have a fourth thickness in the second direction, and the fourth thickness may be equal to or smaller than the second thickness.

In an embodiment, a nitrogen concentration in the fourth charge storage layer may be higher than a nitrogen concentration in the second charge storage layer.

In an embodiment, an oxygen concentration in the fourth charge storage layer may be lower than an oxygen concentration in the second charge storage layer.

In an embodiment, the charge storage layer may further include a fifth charge storage layer disposed between the third charge storage layer and the blocking insulating layer. The fifth charge storage layer may have a fifth energy band gap, and the fifth energy band gap may be smaller than the third energy band gap.

In an embodiment, the fifth charge storage layer may have a fifth thickness in the second direction, and the fifth thickness may be equal to or smaller than the third thickness.

In an embodiment, a nitrogen concentration in the fifth charge storage layer may be higher than a nitrogen concentration in the third charge storage layer.

In an embodiment, an oxygen concentration in the fifth charge storage layer may be lower than an oxygen concentration in the third charge storage layer.

In another aspect, a non-volatile memory device may include a gate electrode on a top surface of a semiconductor substrate, and a charge storage layer between the semiconductor substrate and the gate electrode. The charge storage layer may include first, second and third charge storage layers. The first charge storage layer may be disposed between the semiconductor substrate and the gate electrode, and may have a first energy band gap. The second charge storage layer may be disposed between the first charge storage layer and the semiconductor substrate, and may have a second energy band gap. The third charge storage layer may be disposed between the first charge storage layer and the gate electrode, and may have a third energy band gap. The first energy band gap may be smaller than the second and third energy band gaps. The first, second, and third charge storage layers may have a first thickness, a second thickness, and a third thickness, respectively, in a direction perpendicular to the top surface of the semiconductor substrate. The first thickness may be greater than the second thickness and the third thickness.

In an embodiment, the non-volatile memory device may further include a tunnel insulating layer between the semiconductor substrate and the charge storage layer, and a blocking insulating layer between the charge storage layer and the gate electrode. The first, second, and third energy band gaps may be smaller than energy band gaps of the tunnel insulating layer and the blocking insulating layer.

In an embodiment, the charge storage layer may further include a fourth charge storage layer disposed between the second charge storage layer and the tunnel insulating layer. The fourth charge storage layer may have a fourth energy band gap, and the fourth energy band gap may be smaller than the second energy band gap.

In an embodiment, the fourth charge storage layer may have a fourth thickness in the direction perpendicular to the top surface of the semiconductor substrate, and the fourth thickness may be equal to or smaller than the second thickness.

In an embodiment, the charge storage layer may further include a fifth charge storage layer disposed between the third charge storage layer and the blocking insulating layer. The fifth charge storage layer may have a fifth energy band gap, and the fifth energy band gap may be smaller than the third energy band gap.

In an embodiment, the fifth charge storage layer may have a fifth thickness in the direction perpendicular to the top surface of the semiconductor substrate, and the fifth thickness may be equal to or smaller than the third thickness.

In an embodiment, a nitrogen concentration in the first charge storage layer may be higher than a nitrogen concentration in the second charge storage layer and a nitrogen concentration in the third charge storage layer.

In an embodiment, an oxygen concentration in the first charge storage layer may be lower than an oxygen concentration in the second charge storage layer and an oxygen concentration in the third charge storage layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
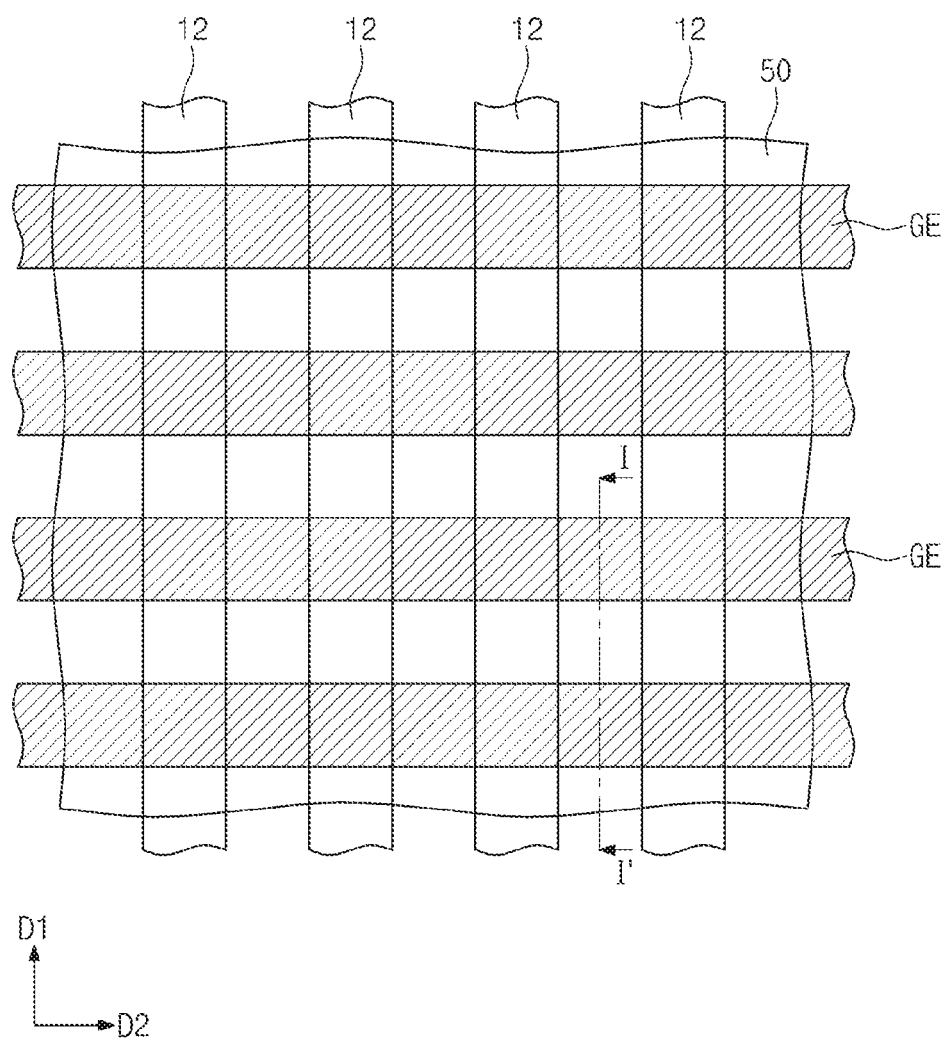
FIG. 1 is a plan view illustrating a non-volatile memory device according to an embodiment of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, example embodiments of the inventive concepts are not limited to the specific examples provided herein and are exaggerated for clarity.

The terminology used herein is for the purpose of describing particular embodiments only and is not intended to limit the inventive concepts. As used herein, the singular forms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concept. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
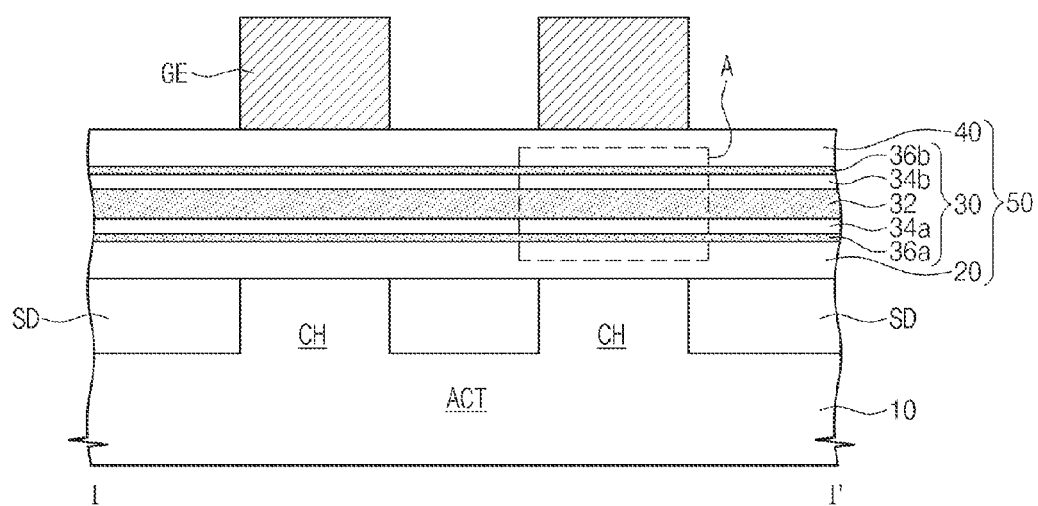
FIG. 2 is a cross-sectional view taken along line I-I' of FIG. 1.
Figure 3:
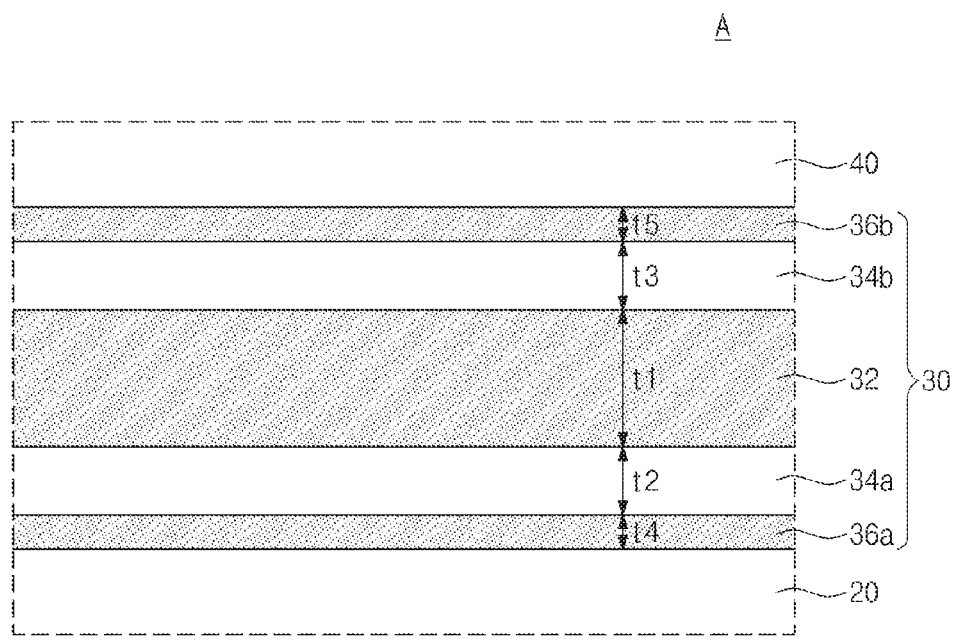
FIG. 3 is an enlarged view of a portion 'A' of FIG. 2.
Figure 4:
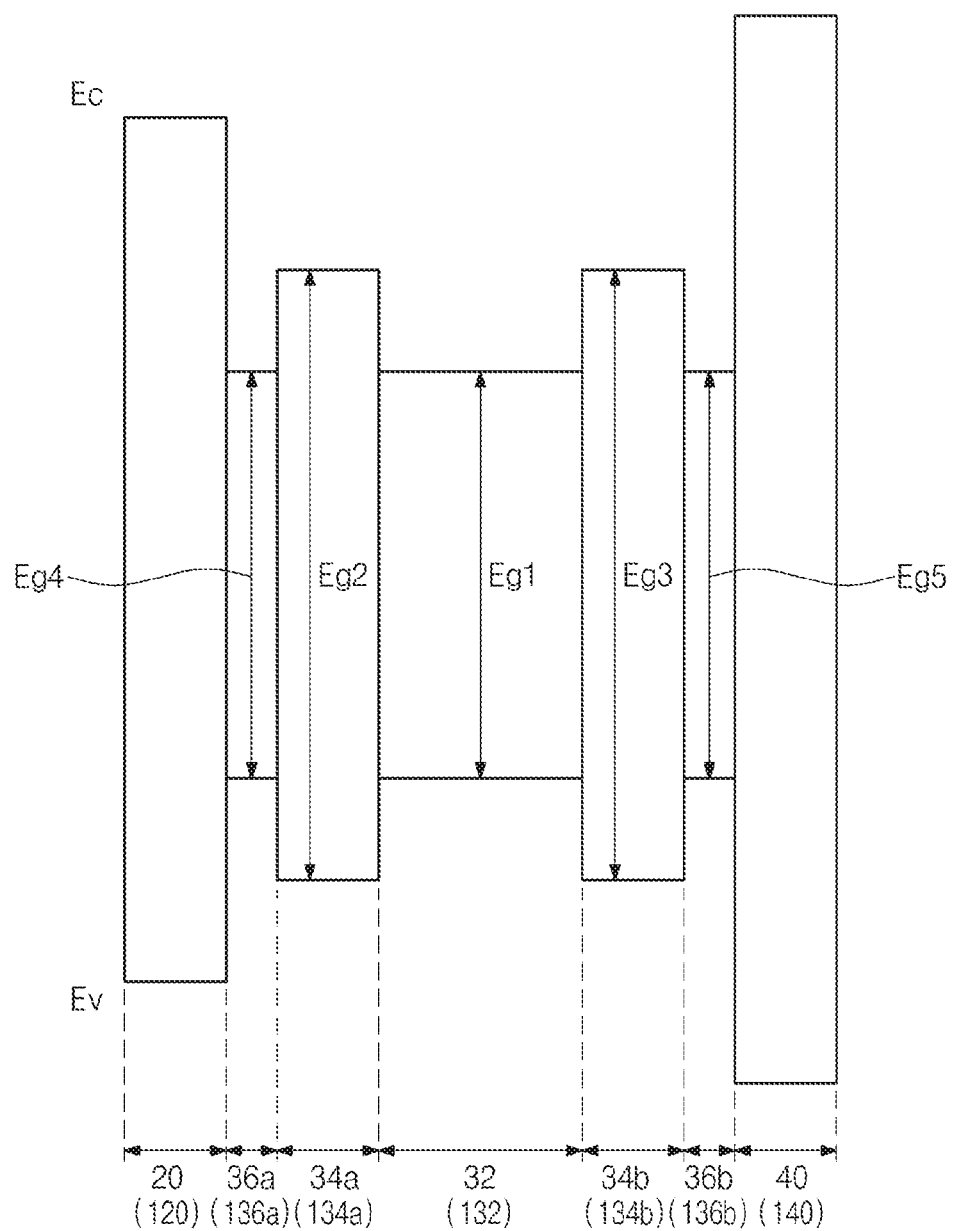
FIG. 4 is an energy band diagram of a charge storage structure according to example embodiments of the inventive concepts.

FIG. 1 is a plan view illustrating a non-volatile memory device according to a first embodiment of the inventive concepts, and FIG. 2 is a cross-sectional view taken along line I-I' of FIG. 1. FIG. 3 is an enlarged view of a portion 'A' of FIG. 2. FIG. 4 is an energy band diagram of a charge storage structure according to example embodiments of the inventive concepts.

Referring to FIGS. 1 to 4, device isolation patterns 12 may be provided on a semiconductor substrate 10 to define active regions ACT. The semiconductor substrate 10 may be a bulk silicon substrate, a silicon-on-insulator (SOI) substrate, a germanium substrate, a germanium-on-insulator (GOI) substrate, a silicon-germanium substrate, or a substrate including an epitaxial layer obtained by performing a selective epitaxial growth (SEG) process.

Each of the device isolation patterns 12 may include an insulating layer that fills a trench formed in the semiconductor substrate 10. The device isolation patterns 12 may have linear shapes extending in a first direction D1 when viewed from a plan view. For example, the device isolation patterns 12 may include an oxide layer, a nitride layer, and/or an oxynitride layer.

Gate electrodes GE may be provided on the semiconductor substrate 10 in which the active regions ACT are defined. The gate electrodes GE may extend in a second direction D2 intersecting the first direction D1. The gate electrodes GE may be arranged in the first direction D1 and may be spaced apart from each other in the first direction D1. For example, the gate electrodes GE may include doped poly-silicon, a metal material (e.g., tungsten (W), platinum (Pt), ruthenium (Ru), or iridium (Ir)), a conductive metal nitride (e.g., titanium nitride (TiN), tantalum nitride (TaN), or tungsten nitride (WN)), a conductive metal oxide (e.g., $RuO_2$ or $IrO_2$) or a combination thereof. Each of the gate electrodes GE may be single-layered or multi-layered. Source/drain regions SD may be provided in the active regions ACT at opposite sides of each of the gate electrodes GE. Portions of the active regions ACT which are disposed under the gate electrodes GE and overlap with the gate electrodes GE in a plan view may be used as channel regions CH.

A charge storage structure 50 used for storing charges may be provided between the semiconductor substrate 10 and the gate electrodes GE. The charge storage structure 50 may include a tunnel insulating layer 20, a charge storage layer 30, and a blocking insulating layer 40 which are sequentially stacked on the semiconductor substrate 10. In an embodiment, the charge storage structure 50 may extend onto top surfaces of the active regions ACT between the gate electrodes GE and onto the device isolation patterns 12 between the active regions ACT. In another embodiment, the charge storage structure 50 may be locally provided on a top surface of each of the active regions ACT.

If a high electric field is formed between the gate electrodes GE and the channel regions CH of the semiconductor substrate 10, charges may tunnel through the tunnel insulating layer 20. In an embodiment, the tunnel insulating layer 20 may include a silicon oxide ($SiO_2$) layer and/or a silicon oxynitride (SiON) layer. In another embodiment, the tunnel insulating layer 20 may include a single-layer or multi-layer that includes at least one of high-k dielectric materials such as $Al_2O_3$, $HfO_2$, $ZrO_2$, $La_2O_3$, $Ta_2O_3$, $TiO_2$, $SrTiO_3$ (STO), or $(Ba,Sr)TiO_3$ (BST). The tunnel insulating layer 20 may be formed using, for example, a thermal oxidation method, a chemical vapor deposition (CVD) method, or an atomic layer deposition (ALD) method.

The charges tunneled from the semiconductor substrate 10 through the tunnel insulating layer 20 may be stored in the charge storage layer 30. The charge storage layer 30 may include a first charge storage layer 32 disposed between the tunnel insulating layer 20 and the blocking insulating layer 40, a second charge storage layer 34a disposed between the tunnel insulating layer 20 and the first charge storage layer 32, and a third charge storage layer 34b disposed between the blocking insulating layer 40 and the first charge storage layer 32. The charge storage layer 30 may further include a fourth charge storage layer 36a disposed between the tunnel insulating layer 20 and the second charge storage layer 34a and a fifth charge storage layer 36b disposed between the blocking insulating layer 40 and the third charge storage layer 34b.

As illustrated in FIG. 4, the first, second, third, fourth, and fifth charge storage layers 32, 34a, 34b, 36a, and 36b may have a first energy band gap Eg1, a second energy band gap Eg2, a third energy band gap Eg3, a fourth energy band gap Eg4, and a fifth energy band gap Eg5, respectively. The first energy band gap Eg1 may be less than the second energy band gap Eg2 and the third energy band gap Eg3. The fourth energy band gap Eg4 may be smaller than the second energy band gap Eg2, and the fifth energy band gap Eg5 may be less than the third energy band gap Eg3. According to an embodiment, the second charge storage layer 34a and the third charge storage layer 34b may have the same conduction band energy level Ec as each other and may have the same valance band energy level Ev as each other. In addition, the fourth charge storage layer 36a and the fifth charge storage layer 36b may have the same conduction band energy level Ec as each other and may have the same valance band energy level Ev as etch other. Moreover, the first charge storage layer 32 may have the same conduction band energy level Ec and the same valance band energy level Ev as the fourth and fifth charge storage layers 36a and 36b. The first to fifth energy band gaps Eg1, Eg2, Eg3, Eg4, and Eg5 may be less than energy band gaps of the tunnel insulating layer 20 and the blocking insulating layer 40.

As illustrated in FIG. 3, the first, second, third, fourth, and fifth charge storage layers 32, 34a, 34b, 36a, and 36b may have a first thickness t1, a second thickness t2, a third thickness t3, a fourth thickness t4, and a fifth thickness t5, respectively, in a direction perpendicular to a top surface of the semiconductor substrate 10. The first thickness t1 may be greater than the second thickness t2 and the third thickness t3. According to an embodiment, the second thickness t2 and the third thickness t3 may be substantially equal to each other. The fourth thickness t4 may be substantially equal to or smaller than the second thickness t2. The fifth thickness t5 may be substantially equal to or less than the third thickness t3.

A nitrogen concentration in the first charge storage layer 32 may be greater than a nitrogen concentration in the second charge storage layer 34a and a nitrogen concentration in the third charge storage layer 34b. A nitrogen concentration in the fourth charge storage layer 36a may be greater than the nitrogen concentration in the second charge storage layer 34a, and a nitrogen concentration in the fifth charge storage layer 36b may be greater than the nitrogen concentration in the third charge storage layer 34b. An oxygen concentration in the first charge storage layer 32 may be lower than an oxygen concentration in the second charge storage layer 34a and an oxygen concentration in the third charge storage layer 34b. An oxygen concentration in the fourth charge storage layer 36a may be less than the oxygen concentration in the second charge storage layer 34a, and an oxygen concentration in the fifth charge storage layer 36b may be less than the oxygen concentration in the third charge storage layer 34b. In an embodiment, the first charge storage layer 32, the fourth charge storage layer 36a, and the fifth charge storage layer 36b may include silicon nitride (SiN), and the second and third charge storage layers 34a and 34b may include silicon oxynitride (SiON).

The first to fifth charge storage layers 32, 34a, 34b, 36a, and 36b may be formed using, for example, a CVD method or an ALD method.

The blocking insulating layer 40 may insulate the charge storage layer 30 from the gate electrodes GE and may prevent charges from moving from the gate electrodes GE to the charge storage layer 30 or from the charge storage layer 30 to the gate electrodes GE. The blocking insulating layer 40 may have an energy band gap greater than those of the tunnel insulating layer 20 and the charge storage layer 30. For example, the blocking insulating layer 40 may include a single-layer or multi-layer that includes at least one of high-k dielectric materials such as $Al_2O_3$, $HfO_2$, $ZrO_2$, $La_2O_3$, $Ta_2O_3$, $TiO_2$, $SrTiO_3$ (STO), or $(Ba,Sr)TiO_3$ (BST). The blocking insulating layer 40 may be formed using, for example, a CVD method or an ALD method.

Figure 5:
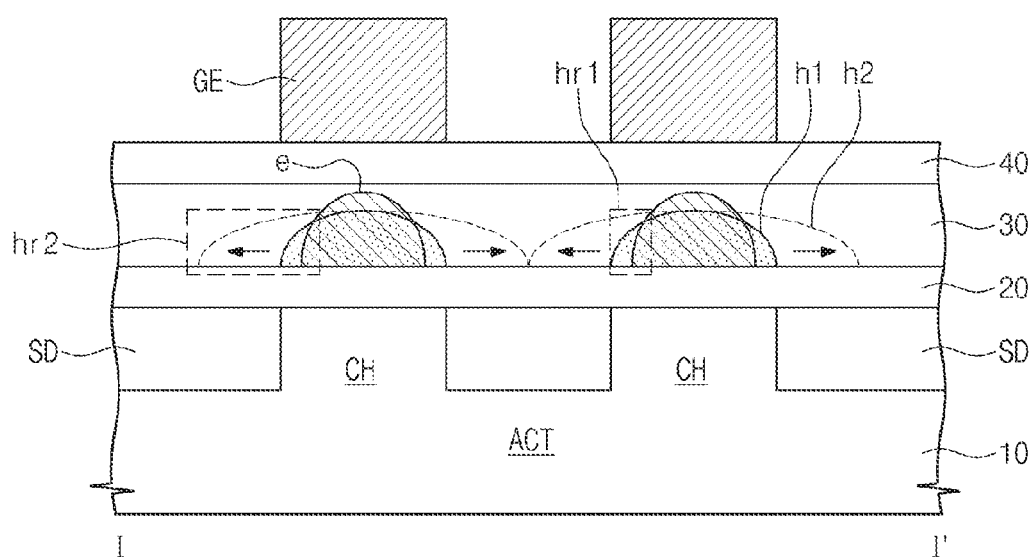
FIG. 5 is a conceptual diagram illustrating distributions of electrons and holes in a charge storage layer according to an erase or program operation of a non-volatile memory device according to example embodiments of the inventive concepts.
Figure 6A:
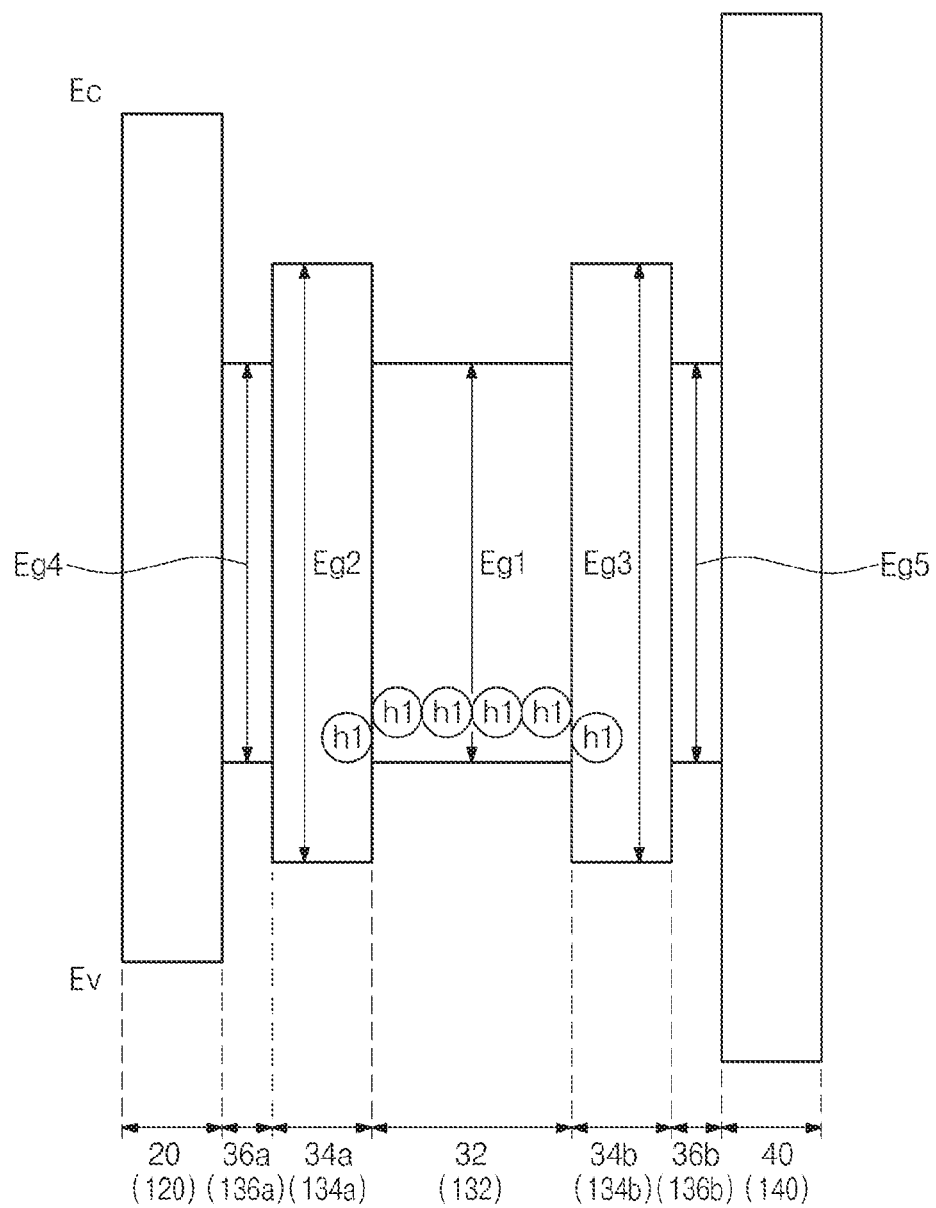
FIGS. 6A and 6B are conceptual diagrams illustrating a principle of inhibiting lateral spreading of holes in a charge storage layer according to example embodiments of the inventive concepts.
Figure 6B:
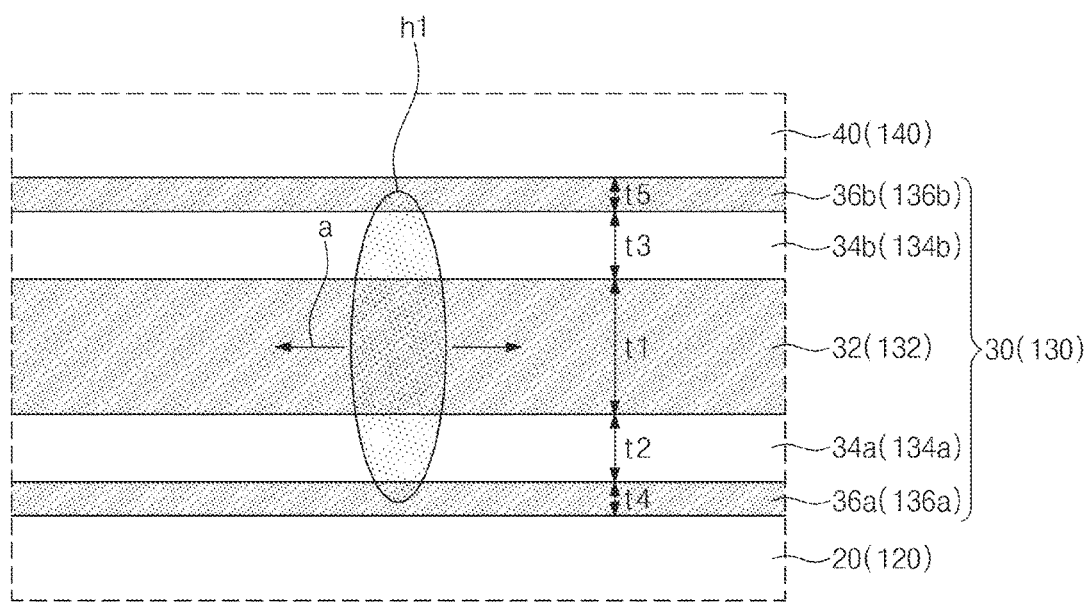
Figure 7A:
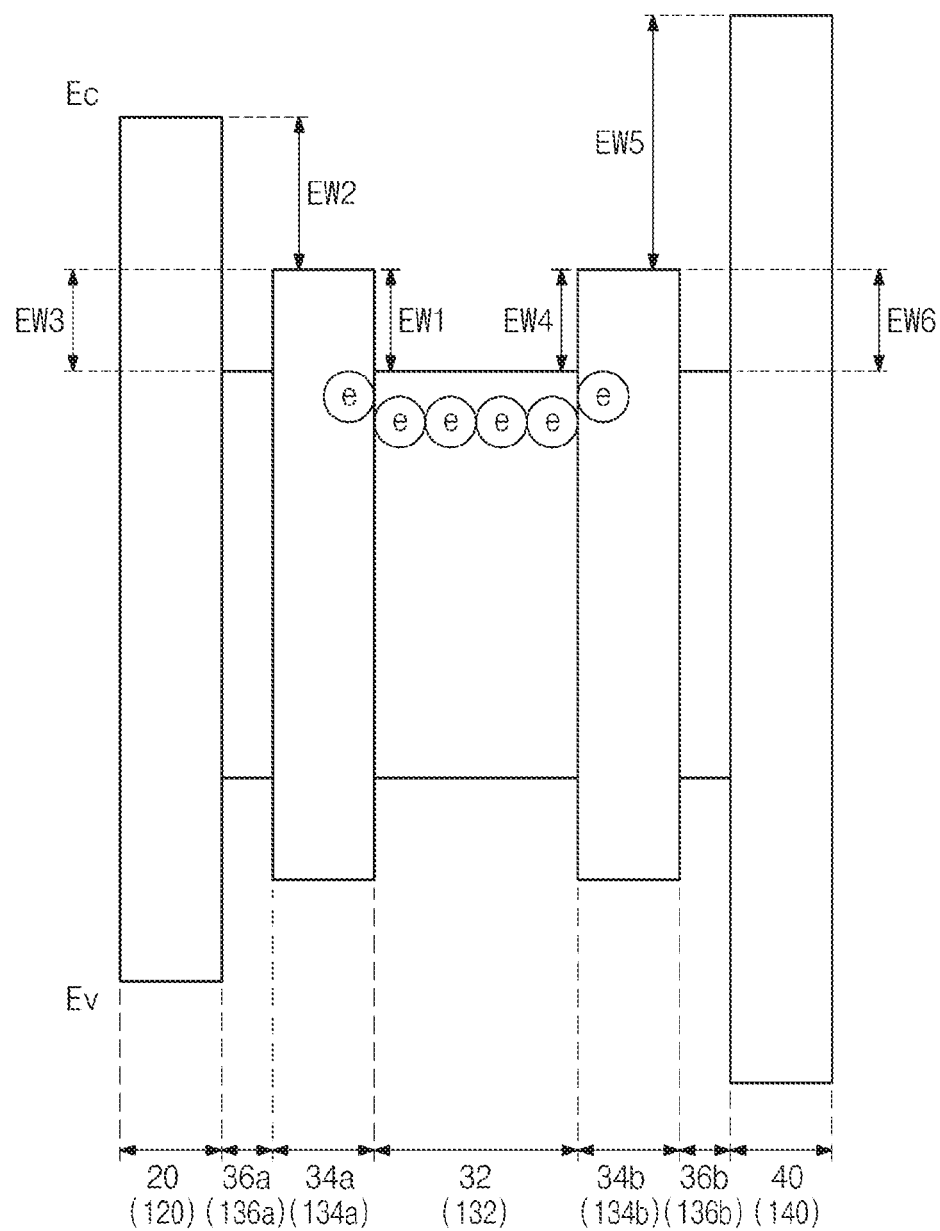
FIGS. 7A and 7B are conceptual diagram illustrating a principle of inhibiting electrons from being leaked from a charge storage layer according to example embodiments of the inventive concepts to neighboring layers.
Figure 7B:
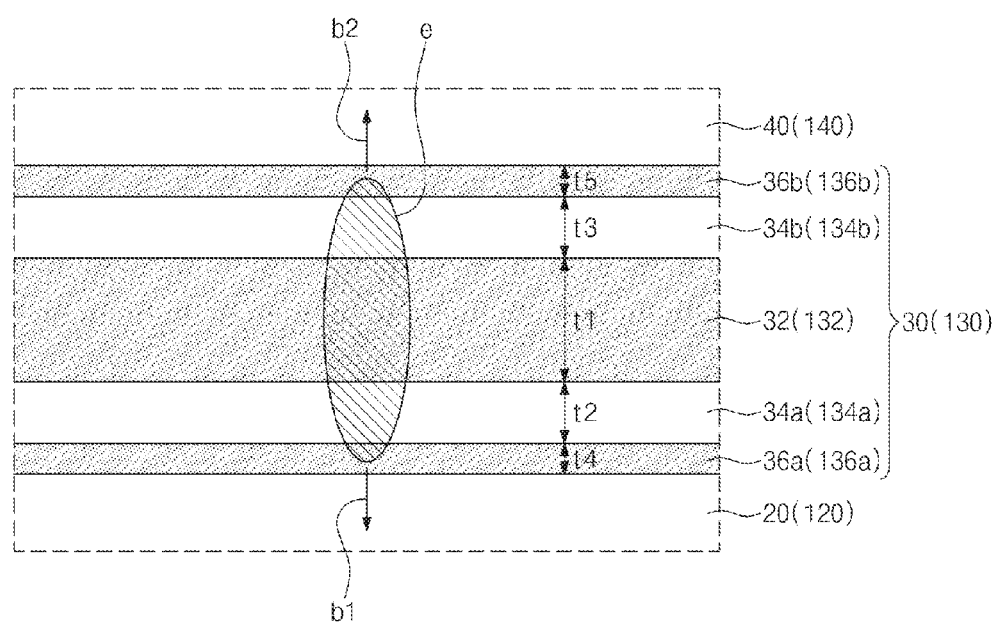

FIG. 5 is a conceptual diagram illustrating distribution of electrons and holes in a charge storage layer according to an erase or program operation of a non-volatile memory device according to example embodiments of the inventive concepts. FIGS. 6A and 6B are conceptual diagrams illustrating a principle of inhibiting lateral spreading of holes in a charge storage layer according to example embodiments of the inventive concepts. FIGS. 7A and 7B are conceptual diagram illustrating a principle of inhibiting electrons from being leaked from a charge storage layer according to example embodiments of the inventive concepts to neighboring layers.

Referring to FIG. 5, after an erase operation of a non-volatile memory device, holes h1 may be distributed in portions of the charge storage layer 30 which are disposed under the gate electrodes GE and overlap with the gate electrodes GE in a plan view, respectively. Thereafter, if a program operation of the non-volatile memory device is performed, electrons e may be distributed in the portions of the charge storage layer 30 which are disposed under the gate electrodes GE and overlap with the gate electrodes GE in a plan view, respectively. In this case, since a driving method of the erase operation is different from that of the program operation, a difference may occur between the distribution of the holes h1 and the distribution of the electrons e. Thus, residual holes hr1 may exist in the charge storage layer 30.

Generally, if a program operation of the non-volatile memory device is performed after a long time from the erase operation, the holes h1 distributed in the charge storage layer 30 after the erase operation may be laterally spread in the charge storage layer 30. The laterally spread holes h2 may be diffused into portions of the charge storage layer 30 which are disposed between gate electrodes GE in a plan view. Thereafter, if the program operation is performed, the residual holes hr1 may be increased by a difference between the distribution of the laterally spread holes h2 and the distribution of the electrons e. A loss of the electrons e in the charge storage layer 30 may occur by the increased residual holes hr2.

Referring to FIGS. 6A and 6B, according to the inventive concepts, the first energy band gap Eg1 of the first charge storage layer 32 may be less than the second energy band gap Eg2 of the second charge storage layer 34a and the third energy band gap Eg3 of the third charge storage layer 34b. In addition, the first thickness t1 of the first charge storage layer 32 may be greater than the second thickness t2 of the second charge storage layer 34a and the third thickness t3 of the third charge storage layer 34b. In other words, the first charge storage layer 32 having the energy band gap less than those of the second and third charge storage layers 34a and 34b may be thicker than the second and third charge storage layers 34a and 34b. Thus, after the erase operation, the holes h1 in the charge storage layer 30 may be widely distributed at a low density along the valance band Ev of the first charge storage layer 32. In this case, even though a long time elapses after the erase operation, lateral spreading a of the holes h1 in the first charge storage layer 32 may be minimized In other words, the increase of the residual holes hr1 in the charge storage layer 30 may be minimized Thus, it is possible to minimize a loss of the electrons e which may be caused by the residual holes hr1 of the charge storage layer 30.

Referring to FIGS. 7A and 7B, according to the inventive concepts, a first energy barrier EW1, a second energy barrier EW2, and a third energy barrier (EW2+EW3) may exist between the tunnel insulating layer 20 and the charge storage layer 30. The first energy barrier EW1 may correspond to a difference between the energy band gap of the first charge storage layer 32 and the energy band gap of the second charge storage layer 34a, and the second energy barrier EW2 may correspond to a difference between the energy band gap of the second charge storage layer 34a and the energy band gap of the tunnel insulating layer 20. The third energy barrier (EW2+EW3) may correspond to a difference between the energy band gap of the fourth charge storage layer 36a and the energy band gap of the tunnel insulating layer 20. Here, the reference number EW3 means a difference between the energy band gap of the second charge storage layer 34a and the energy band gap of the fourth charge storage layer 36a. The first to third energy barriers EW1, EW2, and EW2+EW3 may inhibit the electrons e in the charge storage layer 30 from moving from the charge storage layer 30 to the tunnel insulating layer 20. In FIG. 7B, an arrow b1 means the movement of the electrons e from the charge storage layer 30 to the tunnel insulating layer 20.

In addition, a fourth energy barrier EW4, a fifth energy barrier EW5, and a sixth energy barrier (EW5+EW6) may exist between the blocking insulating layer 40 and the charge storage layer 30. The fourth energy barrier EW4 may correspond to a difference between the energy band gap of the first charge storage layer 32 and the energy band gap of the third charge storage layer 34b, and the fifth energy barrier EW5 may correspond to a difference between the energy band gap of the third charge storage layer 34b and the energy band gap of the blocking insulating layer 40. The sixth energy barrier (EW5+EW6) may correspond to a difference between the energy band gap of the fifth charge storage layer 36b and the energy band gap of the blocking insulating layer 40. Here, the reference number EW6 means a difference between the energy band gap of the third charge storage layer 34b and the energy band gap of the fifth charge storage layer 36b. The fourth to sixth energy barriers EW4, EW5, and EW5+EW6 may inhibit the electrons e in the charge storage layer 30 from moving from the charge storage layer 30 to the blocking insulating layer 40. In FIG. 7B, an arrow b2 means the movement of the electrons e from the charge storage layer 30 to the blocking insulating layer 40.

In other words, it is possible to minimize a loss of the electrons e stored in the charge storage layer 30 which may occur by the movement of the electrons e from the charge storage layer 30 to the tunnel insulating layer 20 and the blocking insulating layer 40.

According to the inventive concepts, it is possible to minimize the increase of the residual holes hr1 in the charge storage layer 30, and it is possible to inhibit the electrons e stored in the charge storage layer 30 from moving to the tunnel insulating layer 20 and the blocking insulating layer 40. As a result, the loss of the electrons e in the charge storage layer 30 may be minimized to improve a charge retention characteristic and reliability of the non-volatile memory device.

Figure 8:
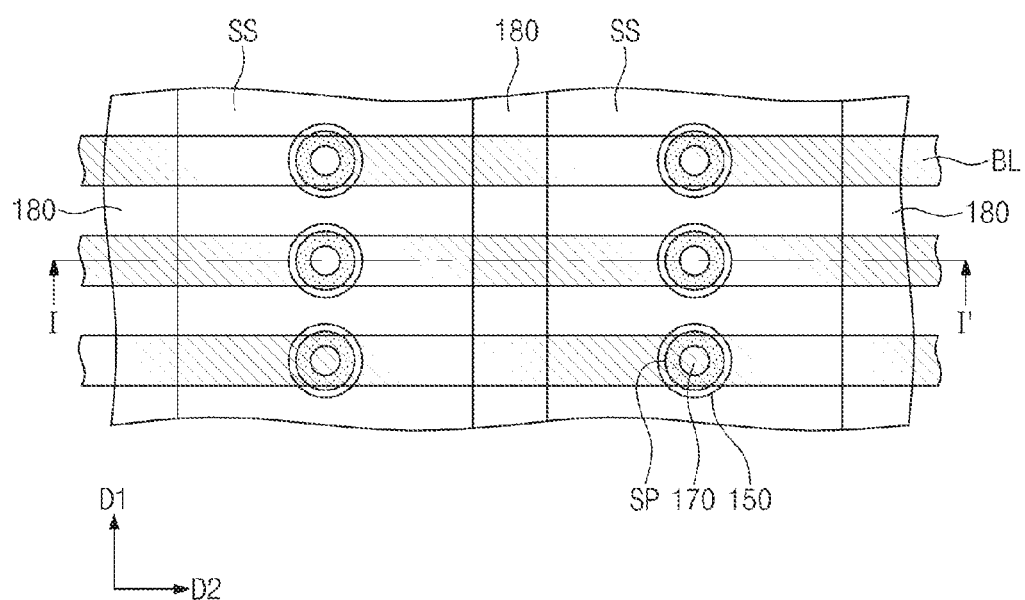
FIG. 8 is a plan view illustrating a non-volatile memory device according to an embodiment of the inventive concepts.
Figure 9:
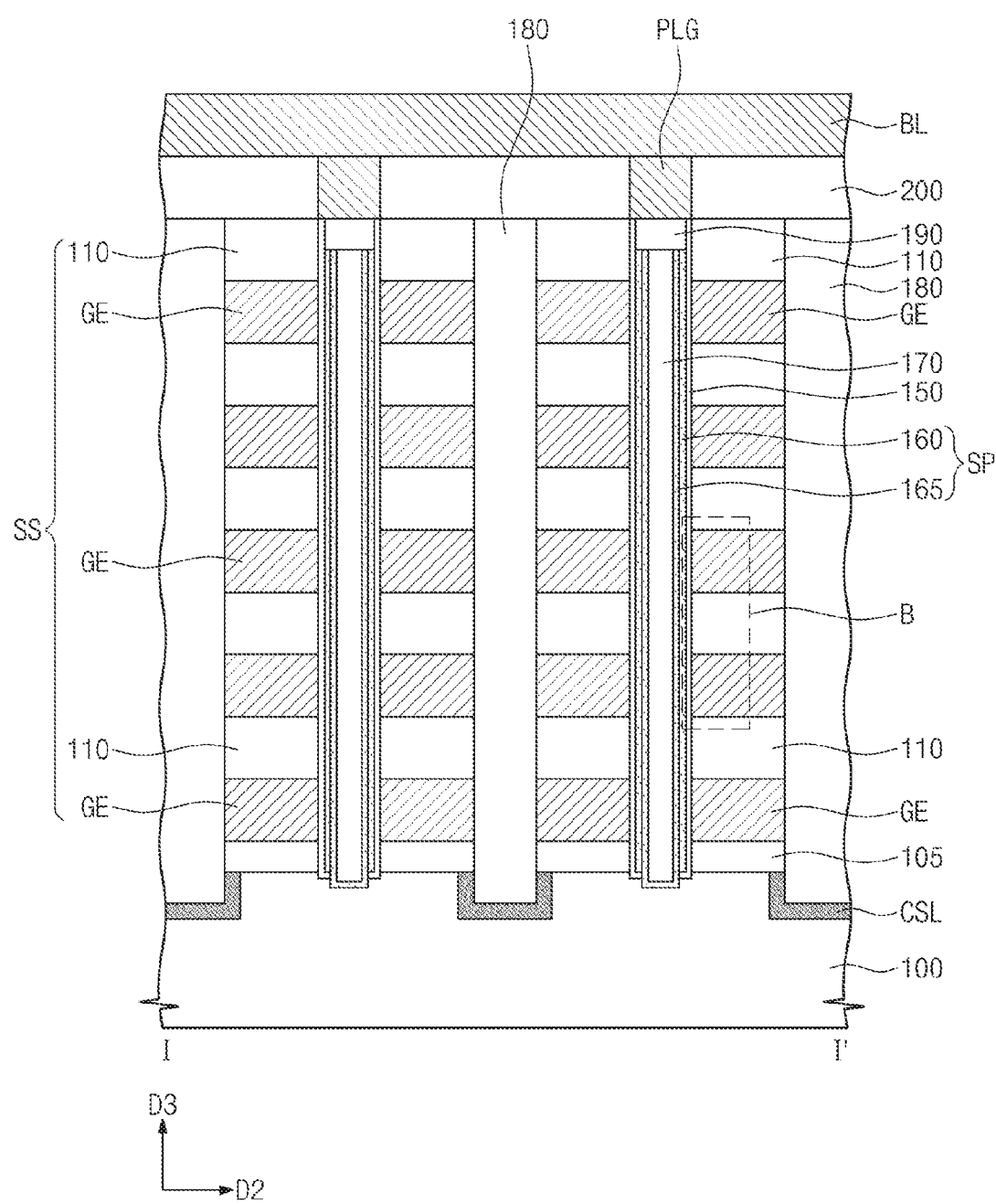
FIG. 9 is a cross-sectional view taken along line I-I' of FIG. 8.
Figure 10:
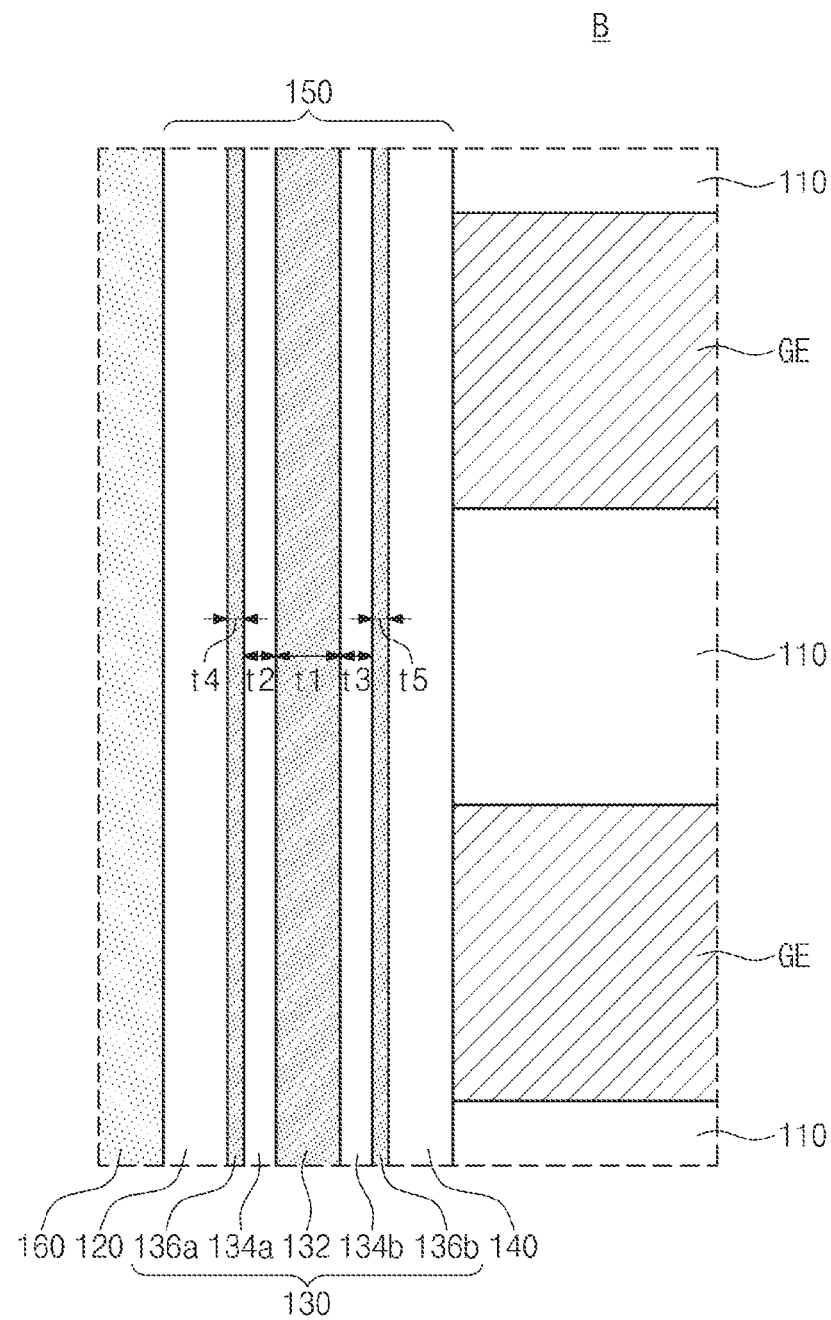
FIG. 10 is an enlarged view of a portion 'B' of FIG. 9.

FIG. 8 is a plan view illustrating a non-volatile memory device according to a second embodiment of the inventive concepts, and FIG. 9 is a cross-sectional view taken along line I-I' of FIG. 8. FIG. 10 is an enlarged view of a portion 'B' of FIG. 9.

Referring to FIGS. 8 to 10, a stack structure SS may be provided on a substrate 100. The stack structure SS may include insulating layers 110 and gate electrodes GE which are alternately and repeatedly stacked. The substrate 100 may be, for example, a silicon substrate, a germanium substrate, or a silicon-germanium substrate. The stack structure SS may have a linear shape extending in a first direction D1 when viewed from a plan view. A second direction D2 may intersect the first direction D1, and a third direction D3 may be perpendicular to the first and second directions D1 and D2. The gate electrodes GE may be stacked in the third direction D3. The gate electrodes GE may be separated from each other by the insulating layers 110 provided between the gate electrodes GE. Each of the insulating layers 110 may include a silicon layer, a silicon oxide layer, a silicon carbide layer, a silicon oxynitride layer, and/or a silicon nitride layer. In some embodiments, the gate electrodes GE may include single-crystalline or poly-crystalline silicon or may include a metal and/or a conductive metal nitride.

A lower insulating layer 105 may be provided between the substrate 100 and the stack structure SS. For example, the lower insulating layer 105 may include a silicon oxide layer, a silicon nitride layer, and/or a high-k dielectric layer (e.g., an aluminum oxide layer and/or a hafnium oxide layer). The lower insulating layer 105 may be thinner than the insulating layers 110.

The substrate 100 may include common source regions CSL doped with dopants. The common source regions CSL may be provided in the substrate 100 at both sides of the stack structure SS. When viewed from a plan view, the common source regions CSL may have linear shapes extending in the first direction D1 and may be spaced apart from each other in the second direction D2.

A plurality of semiconductor patterns SP may penetrate the stack structure SS so as to be electrically connected to the substrate 100. The semiconductor patterns SP may be arranged in the first direction D1 when viewed from a plan view. Unlike FIG. 8, the semiconductor patterns SP may be arranged in a zigzag form along the first direction D1 when viewed from a plan view.

Each of the semiconductor patterns SP may include a first semiconductor pattern 160 and a second semiconductor pattern 165. The first semiconductor pattern 160 may cover an inner sidewall of the stack structure SS (e.g., an inner sidewall of a through-hole penetrating the stack structure SS). The first semiconductor pattern 160 may have a pipe or macaroni shape of which a top end and a bottom end are opened. The first semiconductor pattern 160 may not be in contact with the substrate but may be spaced apart from the substrate 100. The second semiconductor pattern 165 may have a pipe or macaroni shape of which a bottom end is closed. The second semiconductor pattern 165 may be in contact with an inner sidewall of the first semiconductor pattern 160 and the substrate 100. A bottom surface of the second semiconductor pattern 165 may be disposed at a lower level than a top surface of the substrate 100. The second semiconductor pattern 165 may electrically connect the first semiconductor pattern 160 to the substrate 100. In some embodiments, the first and second semiconductor patterns 160 and 165 may be undoped or may be doped with dopants of the same conductivity type as those of the substrate 100. In some embodiments, the first and second semiconductor patterns 160 and 165 may include a semiconductor material having a single-crystalline or poly-crystalline structure.

An inner space of the second semiconductor pattern 165 (e.g., a space surrounded by the second semiconductor pattern 165) may be filled with a filling insulation pattern 170. The filling insulation pattern 170 may include an insulating material (e.g., silicon oxide).

A charge storage structure 150 may be disposed between the stack structure SS and each of the semiconductor patterns SP. The charge storage structure 150 may have a pipe or macaronic shape of which top and bottom ends are opened. According to an embodiment, a bottom portion of the charge storage structure 150 may be in contact with the substrate 100. The bottom portion of the charge storage structure 150 may be disposed between the first semiconductor pattern 160 and the substrate 100.

As illustrated in FIG. 10, the charge storage structure 150 may include a tunnel insulating layer 120, a charge storage layer 130, and a blocking insulating layer 140 which are sequentially stacked between the first semiconductor pattern 160 and the stack structure SS.

If a high electric field is formed between each of the semiconductor patterns SP and the gate electrodes GE, charges may tunnel through the tunnel insulating layer 120. In an embodiment, the tunnel insulating layer 120 may include a silicon oxide ($SiO_2$) layer and/or a silicon oxynitride (SiON) layer. In another embodiment, the tunnel insulating layer 120 may include a single-layer or multi-layer that includes at least one of high-k dielectric materials such as $Al_2O_3$, $HfO_2$, $ZrO_2$, $La_2O_3$, $Ta_2O_3$, $TiO_2$, $SrTiO_3$ (STO), or $(Ba,Sr)TiO_3$ (BST).

The charges tunneled from each of the semiconductor patterns SP through the tunnel insulating layer 120 may be stored in the charge storage layer 130. The charge storage layer 130 may include a first charge storage layer 132 disposed between the tunnel insulating layer 120 and the blocking insulating layer 140, a second charge storage layer 134a disposed between the tunnel insulating layer 120 and the first charge storage layer 132, and a third charge storage layer 134b disposed between the blocking insulating layer 140 and the first charge storage layer 132. In addition, the charge storage layer 130 may further include a fourth charge storage layer 136a disposed between the tunnel insulating layer 120 and the second charge storage layer 134a and a fifth charge storage layer 136b disposed between the blocking insulating layer 140 and the third charge storage layer 134b.

As described with reference to FIG. 4, the first, second, third, fourth, and fifth charge storage layers 132, 134a, 134b, 136a, and 136b may have a first energy band gap Eg1, a second energy band gap Eg2, a third energy band gap Eg3, a fourth energy band gap Eg4, and a fifth energy band gap Eg5, respectively. The first energy band gap Eg1 may be less than the second energy band gap Eg2 and the third energy band gap Eg3. The fourth energy band gap Eg4 may be less than the second energy band gap Eg2, and the fifth energy band gap Eg5 may be less than the third energy band gap Eg3. According to an embodiment, the second charge storage layer 134a and the third charge storage layer 134b may have the same conduction band energy level Ec as each other and may have the same valance band energy level Ev as each other. In addition, the fourth charge storage layer 136a and the fifth charge storage layer 136b may have the same conduction band energy level Ec as each other and may have the same valance band energy level Ev as etch other. Moreover, the first charge storage layer 132 may have the same conduction band energy level Ec and the same valance band energy level Ev as the fourth and fifth charge storage layers 136a and 136b. The first to fifth energy band gaps Eg1, Eg2, Eg3, Eg4, and Eg5 may be less than energy band gaps of the tunnel insulating layer 120 and the blocking insulating layer 140.

As illustrated in FIG. 10, the first, second, third, fourth, and fifth charge storage layers 132, 134a, 134b, 136a, and 136b may have a first thickness t1, a second thickness t2, a third thickness t3, a fourth thickness t4, and a fifth thickness t5 in the second direction D2, respectively. The first thickness t1 may be greater than the second thickness t2 and the third thickness t3. According to an embodiment, the second thickness t2 and the third thickness t3 may be substantially equal to each other. The fourth thickness t4 may be substantially equal to or less than the second thickness t2. The fifth thickness t5 may be substantially equal to or less than the third thickness t3.

A nitrogen concentration in the first charge storage layer 132 may be greater than a nitrogen concentration in the second charge storage layer 134a and a nitrogen concentration in the third charge storage layer 134b. A nitrogen concentration in the fourth charge storage layer 136a may be greater than the nitrogen concentration in the second charge storage layer 134a, and a nitrogen concentration in the fifth charge storage layer 136b may be greater than the nitrogen concentration in the third charge storage layer 134b. An oxygen concentration in the first charge storage layer 132 may be less than an oxygen concentration in the second charge storage layer 134a and an oxygen concentration in the third charge storage layer 134b. An oxygen concentration in the fourth charge storage layer 136a may be lower than the oxygen concentration in the second charge storage layer 134a, and an oxygen concentration in the fifth charge storage layer 136b may be less than the oxygen concentration in the third charge storage layer 134b. In an embodiment, the first charge storage layer 132, the fourth charge storage layer 136a, and the fifth charge storage layer 136b may include silicon nitride (SiN), and the second and third charge storage layers 134a and 134b may include silicon oxynitride (SiON).

The blocking insulating layer 140 may insulate the charge storage layer 130 from the gate electrodes GE and may prevent charges from moving from the gate electrodes GE to the charge storage layer 130 or from the charge storage layer 130 to the gate electrodes GE. The blocking insulating layer 140 may have an energy band gap greater than those of the tunnel insulating layer 120 and the charge storage layer 130. For example, the blocking insulating layer 140 may include a single-layer or multi-layer that includes at least one of high-k dielectric materials such as $Al_2O_3$, $HfO_2$, $ZrO_2$, $La_2O_3$, $Ta_2O_3$, $TiO_2$, $SrTiO_3$ (STO), or $(Ba,Sr)TiO_3$ (BST).

According to the inventive concepts, the first charge storage layer 132 having the energy band gap smaller than those of the second and third charge storage layers 134a and 134b may be thicker than the second and third charge storage layers 134a and 134b. Thus, after an erase operation of a non-volatile memory device, holes h1 in the charge storage layer 130 may be widely distributed at a low density along the valance band Ev of the first charge storage layer 132, as described with reference to FIGS. 5, 6A, and 6B. In this case, even though a long time elapses after the erase operation, lateral spreading a of the holes h1 in the first charge storage layer 132 may be minimized In other words, the increase of the residual holes hr1 in the charge storage layer 130 may be minimized Thus, it is possible to minimize a loss of the electrons e which may be caused by the residual holes hr1 of the charge storage layer 130.

In addition, as described with reference to FIGS. 7A and 7B, a first energy barrier EW1, a second energy barrier EW2, and a third energy barrier (EW2+EW3) may exist between the tunnel insulating layer 120 and the charge storage layer 130. The first energy barrier EW1 may correspond to a difference between the energy band gap of the first charge storage layer 132 and the energy band gap of the second charge storage layer 134a, and the second energy barrier EW2 may correspond to a difference between the energy band gap of the second charge storage layer 134a and the energy band gap of the tunnel insulating layer 120. The third energy barrier (EW2+EW3) may correspond to a difference between the energy band gap of the fourth charge storage layer 136a and the energy band gap of the tunnel insulating layer 120. Here, the reference number EW3 means a difference between the energy band gap of the second charge storage layer 134a and the energy band gap of the fourth charge storage layer 136a. The first to third energy barriers EW1, EW2, and EW2+EW3 may inhibit the electrons e in the charge storage layer 130 from moving from the charge storage layer 130 to the tunnel insulating layer 120.

A fourth energy barrier EW4, a fifth energy barrier EW5, and a sixth energy barrier (EW5+EW6) may exist between the blocking insulating layer 140 and the charge storage layer 130. The fourth energy barrier EW4 may correspond to a difference between the energy band gap of the first charge storage layer 132 and the energy band gap of the third charge storage layer 134b, and the fifth energy barrier EW5 may correspond to a difference between the energy band gap of the third charge storage layer 134b and the energy band gap of the blocking insulating layer 140. The sixth energy barrier (EW5+EW6) may correspond to a difference between the energy band gap of the fifth charge storage layer 136b and the energy band gap of the blocking insulating layer 140. Here, the reference number EW6 means a difference between the energy band gap of the third charge storage layer 134b and the energy band gap of the fifth charge storage layer 136b. The fourth to sixth energy barriers EW4, EW5, and EW5+EW6 may inhibit the electrons e in the charge storage layer 130 from moving from the charge storage layer 130 to the blocking insulating layer 140.

In other words, it is possible to minimize a loss of the electrons e stored in the charge storage layer 130 which may occur by the movement of the electrons e from the charge storage layer 130 to the tunnel insulating layer 120 and the blocking insulating layer 140.

According to the inventive concepts, it is possible to minimize the increase of the residual holes hr1 in the charge storage layer 130, and it is possible to inhibit the electrons e stored in the charge storage layer 130 from moving to the tunnel insulating layer 120 and the blocking insulating layer 140. As a result, the loss of the electrons e in the charge storage layer 130 may be minimized to improve a charge retention characteristic and reliability of the non-volatile memory device.

Conductive pads 190 may penetrate the stack structure SS so as to be connected to the semiconductor patterns SP, respectively. Top surfaces of the conductive pads 190 may be substantially coplanar with a top surface of the stack structure SS. Bottom surfaces of the conductive pads 190 may be in direct contact with the semiconductor patterns SP, respectively. The charge storage structure 150 may also be disposed between each of the conductive pads 190 and the insulating layer 110 adjacent to each of the conductive pads 190. The conductive pad 190 may be a dopant region doped with dopants or may include a conductive material.

Electrode isolation patterns 180 may be disposed at both sides of the stack structure SS. The electrode isolation patterns 180 may include a silicon oxide layer, a silicon nitride layer, and/or a silicon oxynitride layer. The electrode isolation patterns 180 may cover the common source regions CSL, respectively.

An interlayer insulating layer 200 may be provided on the stack structure SS. For example, the interlayer insulating layer 200 may include a silicon oxide layer, a silicon nitride layer, and/or a silicon oxynitride layer. Bit lines BL intersecting the stack structure SS may be disposed on the interlayer insulating layer 200. The bit lines BL may be connected to the conductive pads 190 through contact plugs PLG. The contact plugs PLG may penetrate the interlayer insulating layer 200 to electrically connect the bit lines BL to the conductive pads 190. The bit lines BL and the contact plugs PLG may include a conductive material (e.g., a metal).

FIGS. 11 to 15 are cross-sectional views corresponding to line I-I' of FIG. 8 to illustrate a method of manufacturing the non-volatile memory device according to the second embodiment of the inventive concepts. FIG. 16 is an enlarged view of a portion 'C' of FIG. 12.

Figure 11:
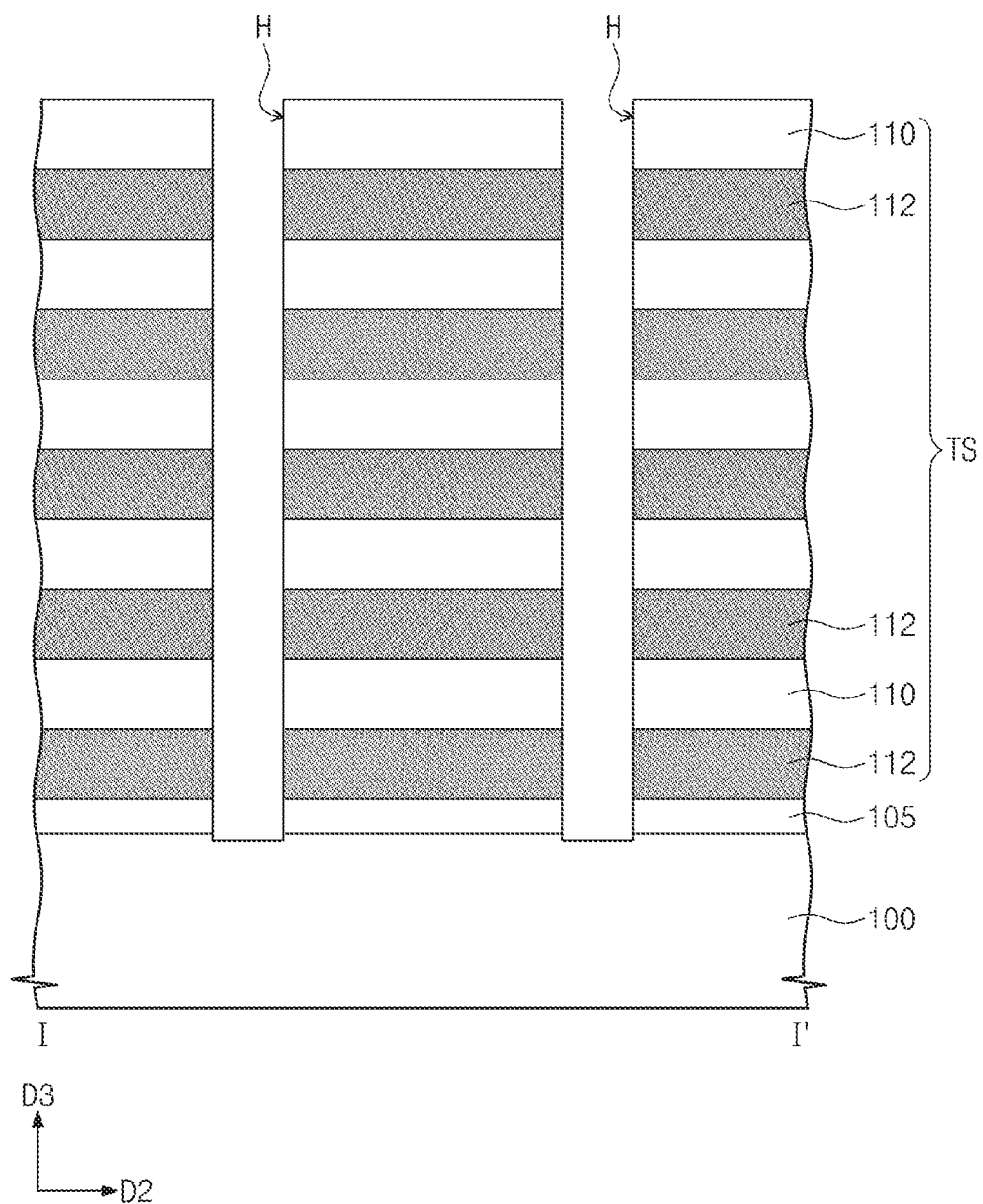
FIGS. 11, 12, 13, 14 and 15 are cross-sectional views corresponding to line I-I' of FIG. 8 to illustrate a method of manufacturing the non-volatile memory device according to embodiments of the inventive concepts.

Referring to FIG. 11, a lower insulating layer 105 may be formed on a substrate 100. For example, the substrate 100 may be a silicon substrate, a germanium substrate, or a silicon-germanium substrate. For example, the lower insulating layer 105 may include a silicon oxide layer formed by a thermal oxidation process or a silicon oxide layer formed by a deposition technique.

Sacrificial layers 112 and insulating layers 110 may be alternately and repeatedly stacked on the lower insulating layer 105 to form a thin-layer structure TS.

According to an embodiment, the sacrificial layers 112 may have the same thickness. Alternatively, the lowermost one and the uppermost one of the sacrificial layers 112 may be thicker than other sacrificial layers 112 disposed between the lowermost and uppermost sacrificial layers. The insulating layers 110 may have the same thickness. Alternatively, a thickness of one or some of the insulating layers 110 may be different from those of others of the insulating layers 110. The lower insulating layer 105 may be thinner than the sacrificial layers 112 and the insulating layers 110.

The sacrificial layers 112 and the insulating layers 110 may be formed by, for example, a thermal CVD process, a plasma-enhanced CVD process, a physical CVD process, or an ALD process.

In some embodiments, the sacrificial layers 112 may include a material having an etch selectivity with respect to the insulating layers 110. For example, each of the sacrificial layers 112 may include a silicon layer, a silicon oxide layer, a silicon carbide layer, a silicon oxynitride layer, a silicon nitride layer or a combination thereof. Each of the insulating layers 110 may a silicon layer, a silicon oxide layer, a silicon carbide layer, a silicon oxynitride layer, a silicon nitride layer or a combination thereof. Here, the insulating layers 110 include a different material from the sacrificial layers 112. In an embodiment, the sacrificial layers 112 may be formed of silicon nitride layers, and the insulating layers 110 may be formed of silicon oxide layers. Alternatively, the sacrificial layers 112 may be formed of a conductive material, and the insulating layers 110 may be formed of an insulating material.

Through-holes H may be formed to penetrate the thin-layer structure TS. The through-holes H may expose the substrate 100. The through-holes H may be two-dimensionally arranged when viewed from a plan view. In an embodiment, the through-holes H may be arranged along the first direction D1. In another embodiment, the through-holes H may be arranged in a zigzag form along the first direction D1.

In some embodiments, a first mask pattern (not shown) having openings defining the through-holes H may be formed on the thin-layer structure TS, and the thin-layer structure TS may be anisotropically etched using the first mask pattern an etch mask to form the through-holes H. The first mask pattern may be formed of a material having an etch selectivity with respect to the sacrificial layers 112 and the insulating layers 110. A top surface of the substrate 100 under the through-holes H may be over-etched by the etching process, so the top surface of the substrate 100 exposed by the through-holes H may be recessed.

Figure 12:
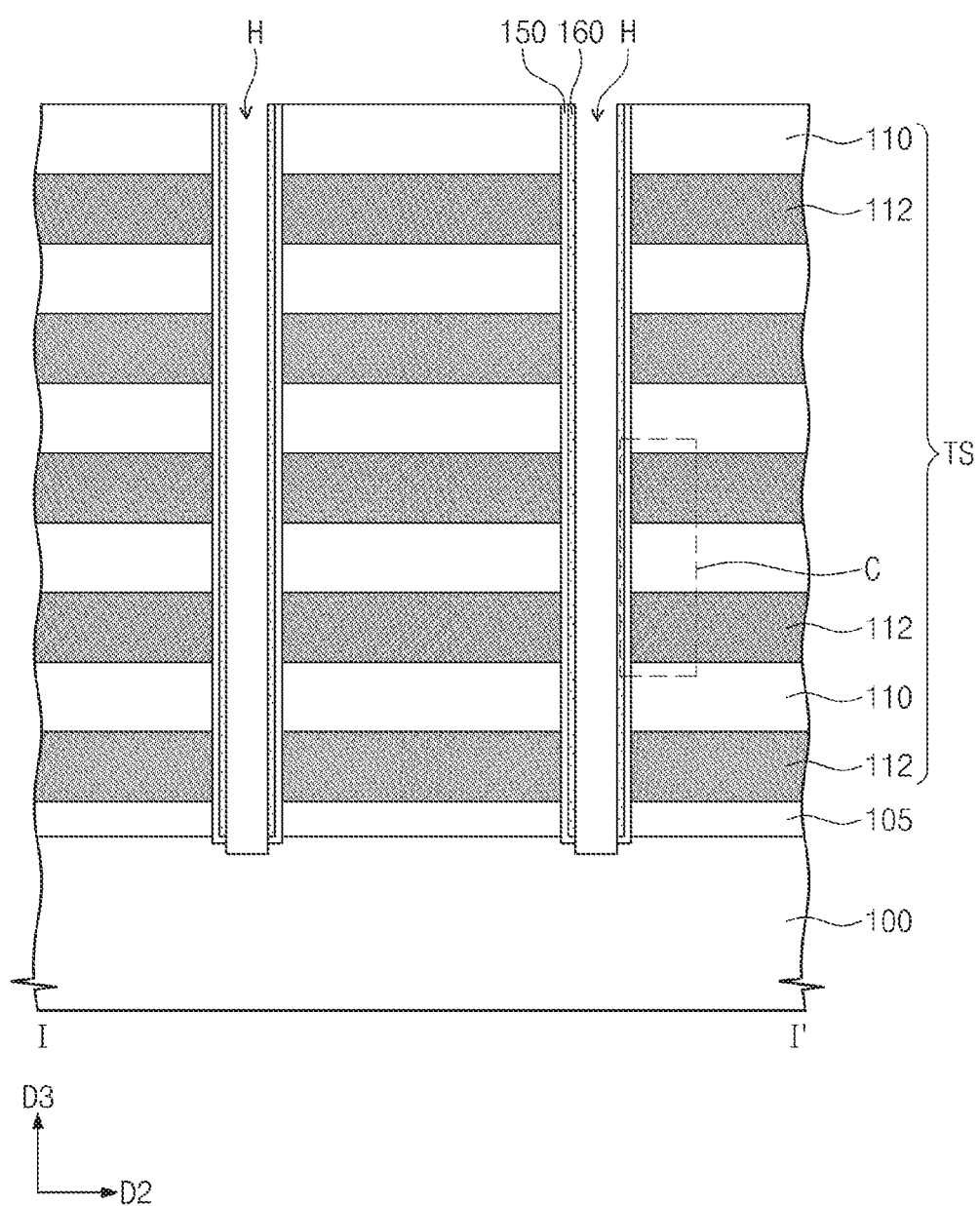

Referring to FIGS. 12 and 16, a charge storage structure 150 and a first semiconductor pattern 160 may be formed to cover an inner sidewall of each of the through-holes H and to expose the substrate 100.

In more detail, a charge storage structure layer and a first semiconductor layer may be sequentially formed to cover the inner sidewalls of the through-holes H. The charge storage structure layer and the first semiconductor layer may partially fill each of the through-holes H. In other words, each of the through-holes H may not be completely filled with the charge storage structure layer and the first semiconductor layer.

The charge storage structure layer may cover the top surface of the substrate 100 exposed by the through-holes H. For example, the charge storage structure layer may be deposited using at least one of a plasma-enhanced CVD technique, a physical CVD technique, or an ALD technique. The first semiconductor layer may be formed on the charge storage structure layer. According to an embodiment, the first semiconductor layer may include a semiconductor material formed by an ALD technique or a CVD technique. The first semiconductor layer may be, for example, a polycrystalline silicon layer. In an embodiment, the first semiconductor layer may be deposited in an amorphous state, and an annealing process may be performed to crystallize the first semiconductor layer deposited in the amorphous state.

After the charge storage structure layer and the first semiconductor layer are sequentially formed, the first semiconductor layer and the charge storage structure layer may be anisotropically etched to expose the substrate 100. Thus, the charge storage structure 150 and the first semiconductor pattern 160 may be formed on the inner sidewall of each of the through-holes H. For example, each of the charge storage structure 150 and the first semiconductor pattern 160 may have a hollow cylindrical shape of which both ends are opened. The top surface of the substrate 100 exposed by the first semiconductor pattern 160 and the charge storage structure 150 may be recessed by over-etching during the anisotropic etching process performed on the first semiconductor layer and the charge storage structure layer.

During the anisotropic etching process, a portion of the charge storage structure layer disposed under the first semiconductor pattern 160 may not be etched. In this case, the charge storage structure 150 may have a bottom portion disposed between a bottom surface of the first semiconductor pattern 160 and the top surface of the substrate 100.

In addition, a top surface of the thin-layer structure TS may be exposed during the anisotropic etching process performed on the first semiconductor layer and the charge storage structure layer, so the charge storage structure 150 and the first semiconductor pattern 160 may be confinedly formed in each of the through-holes H.

As illustrated in FIG. 16, the charge storage structure 150 may include a tunnel insulating layer 120, a charge storage layer 130, and a blocking insulating layer 140 which are sequentially stacked between the first semiconductor pattern 160 and the thin-layer structure TS. The blocking insulating layer 140, the charge storage layer 130 and the tunnel insulating layer 120 may sequentially deposited on the inner sidewall of each of the through-holes H by a plasma-enhanced CVD technique, a physical CVD technique, or an ALD technique.

The charge storage layer 130 may include a first charge storage layer 132 disposed between the tunnel insulating layer 120 and the blocking insulating layer 140, a second charge storage layer 134a disposed between the tunnel insulating layer 120 and the first charge storage layer 132, and a third charge storage layer 134b disposed between the blocking insulating layer 140 and the first charge storage layer 132. In addition, the charge storage layer 130 may further include a fourth charge storage layer 136a disposed between the tunnel insulating layer 120 and the second charge storage layer 134a and a fifth charge storage layer 136b disposed between the blocking insulating layer 140 and the third charge storage layer 134b. Forming the charge storage layer 130 may include sequentially depositing the fifth charge storage layer 136b, the third charge storage layer 134b, the first charge storage layer 132, the second charge storage layer 134a, and the fourth charge storage layer 136a on the inner sidewall of each of the through-holes H by a plasma-enhanced CVD technique, a physical CVD technique, or an ALD technique.

Figure 13:
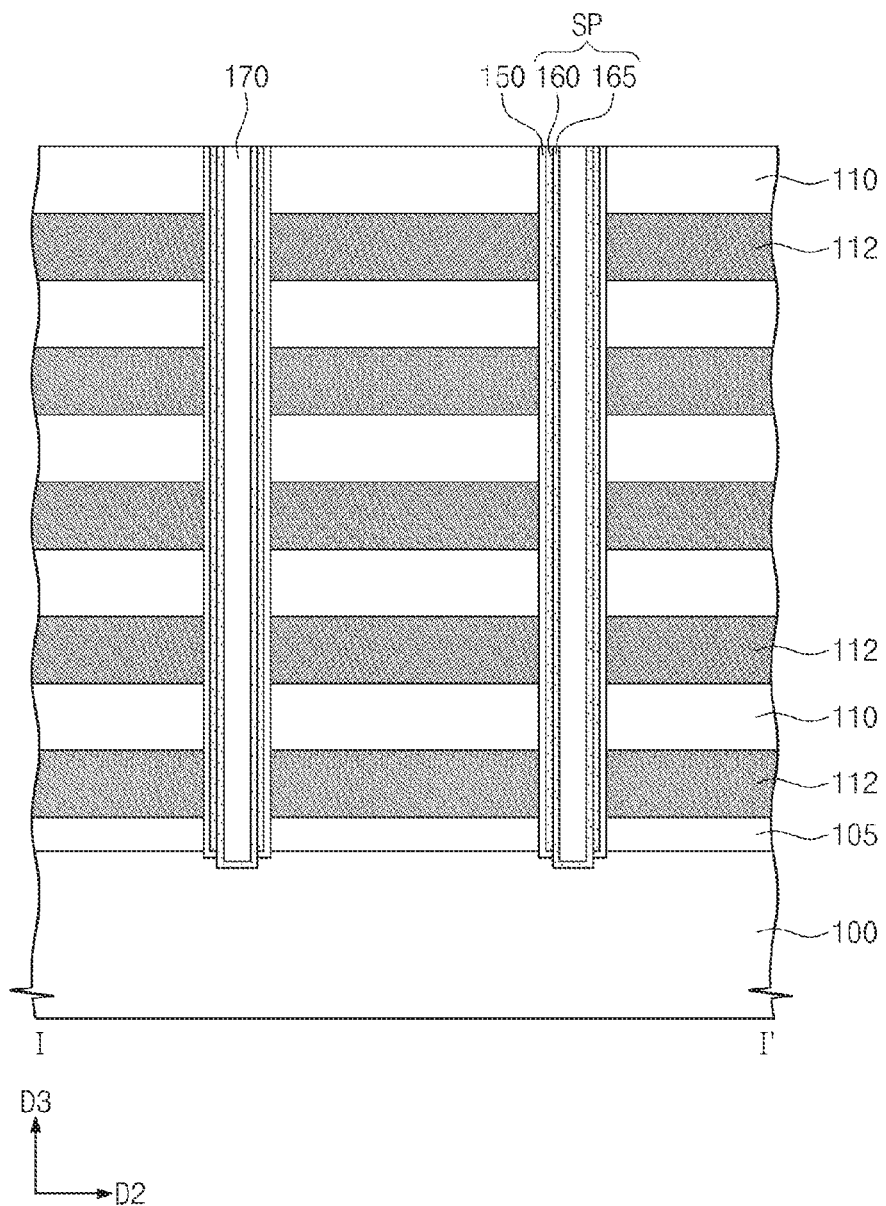

Referring to FIG. 13, a second semiconductor pattern 165 and a filling insulation pattern 170 may be formed to fill the rest region of each of the through-holes H.

In more detail, a second semiconductor layer and a filling insulation layer may be sequentially formed on the substrate 100 having the charge storage structure 150 and the first semiconductor pattern 160. The second semiconductor layer may not completely fill each of the through-holes H. The second semiconductor layer may cover the inner sidewalls of the through-holes H and may also cover the top surface of the substrate 100 exposed by the charge storage structure 150 and the first semiconductor pattern 160. The second semiconductor layer may electrically connect the first semiconductor pattern 160 to the substrate 100. The second semiconductor layer may include a semiconductor material formed by an ALD technique or a CVD technique. The second semiconductor layer may be, for example, a polycrystalline silicon layer. In an embodiment, the second semiconductor layer may be deposited in an amorphous state, and an annealing process may be performed to crystallize the second semiconductor layer deposited in the amorphous state. The filling insulation layer may be formed to completely fill the through-holes H. The filling insulation layer may include insulating materials (e.g., silicon oxide) which are formed using a spin-on-glass (SOG) technique. The filling insulation layer and the second semiconductor layer may be planarized to form the second semiconductor pattern 165 and the filling insulation pattern 170 in each of the through-holes H. The second semiconductor pattern 165 and the filling insulation pattern 170 may be confinedly formed in each of the through-holes H by the planarization process. The first and second semiconductor patterns 160 and 165 may constitute a semiconductor pattern SP.

Figure 14:
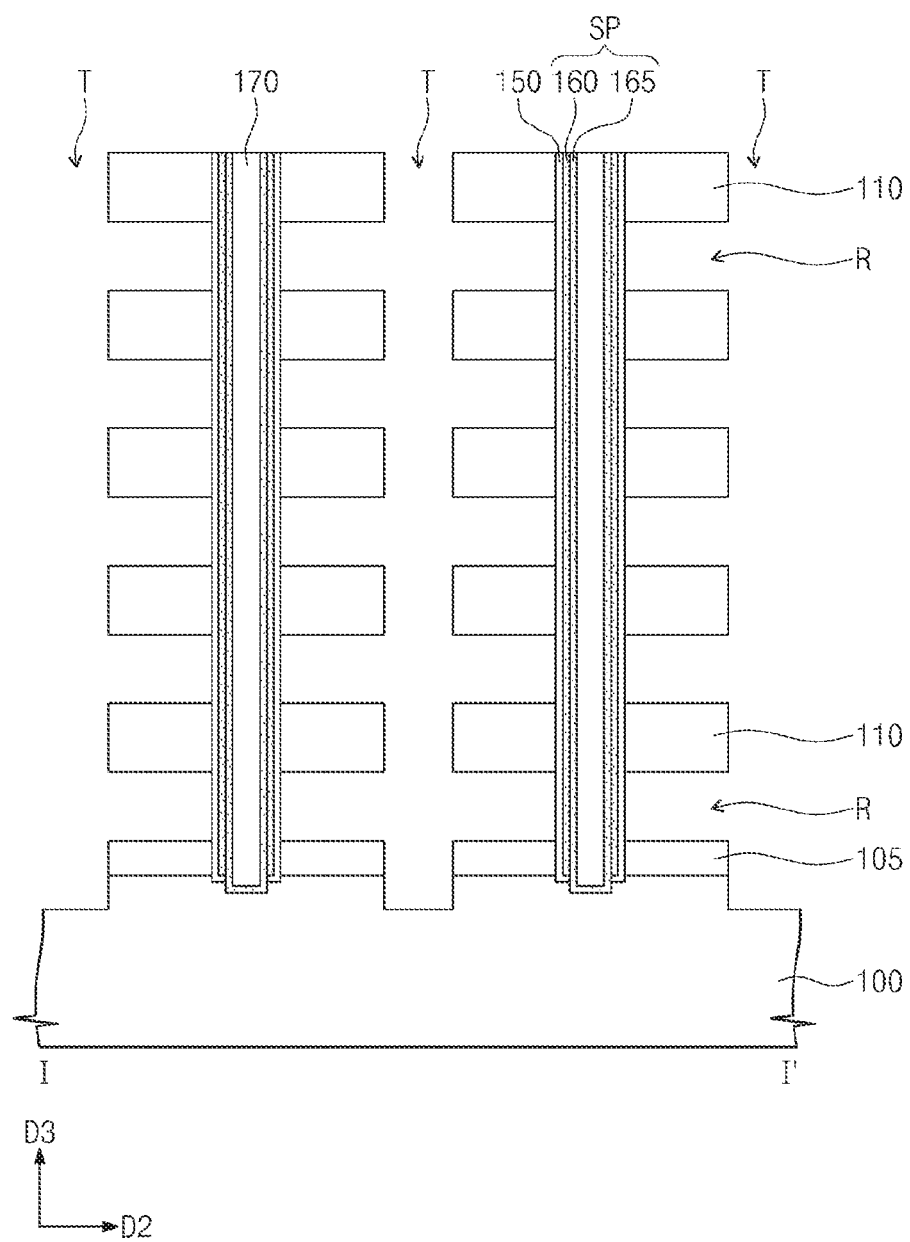

Referring to FIG. 14, the thin-layer structure TS may be patterned to form trenches T exposing the substrate 100 between the through-holes H.

In some embodiments, a second mask pattern (not shown) defining planar positions of the trenches T may be formed on the thin-layer structure TS, and the thin-layer structure TS may be anisotropically etched using the second mask pattern as an etch mask to form the trenches.

The trenches T may be spaced apart from the semiconductor patterns SP to expose sidewalls of the sacrificial layers 112 and sidewalls of the insulating layers 110. The trench T may have a linear shape or a rectangular shape when viewed from a plan view. The trench T may expose the top surface of the substrate 100 when viewed from a cross-sectional view. The substrate 100 under the trench T may be recessed by over-etching during the etching process for the formation of the trench T.

A width of the trench T may be varied according to a distance from the substrate 100, unlike FIG. 14. For example, a width of a lower portion of the trench T may be less than a width of an upper portion of the trench T.

Since the trenches T are formed, the thin-layer structure TS may have a linear shape extending in the first direction D1, as illustrated in FIG. 8. A plurality of the semiconductor patterns SP may penetrate one line-shaped thin-layer structure TS.

The sacrificial layers 112 exposed by the trenches T may be removed to form recess regions R between the insulating layers 110. The sacrificial layers 112 may be isotropically etched using an etch recipe having an etch selectivity with respect to the insulating layers 110, the charge storage structure 150, the semiconductor pattern SP, the lower insulating layer 105 and the substrate 100, so the recess regions R may be formed. The sacrificial layers 112 may be completely removed by the isotropic etching process. For example, if the sacrificial layers 112 are silicon nitride layers and the insulating layers 110 are silicon oxide layers, the isotropic etching process may be performed using an etching solution including phosphoric acid.

The recess regions R may horizontally extend from the trench T into between the insulating layers 110 and between the lower insulating layer 105 and the lowermost one of the insulating layers 110. Each of the recess regions R may expose a portion of a sidewall of the charge storage structure 150. Vertical heights of the recess regions R may be substantially equal to the thicknesses of the sacrificial layers 107, respectively.

Figure 15:
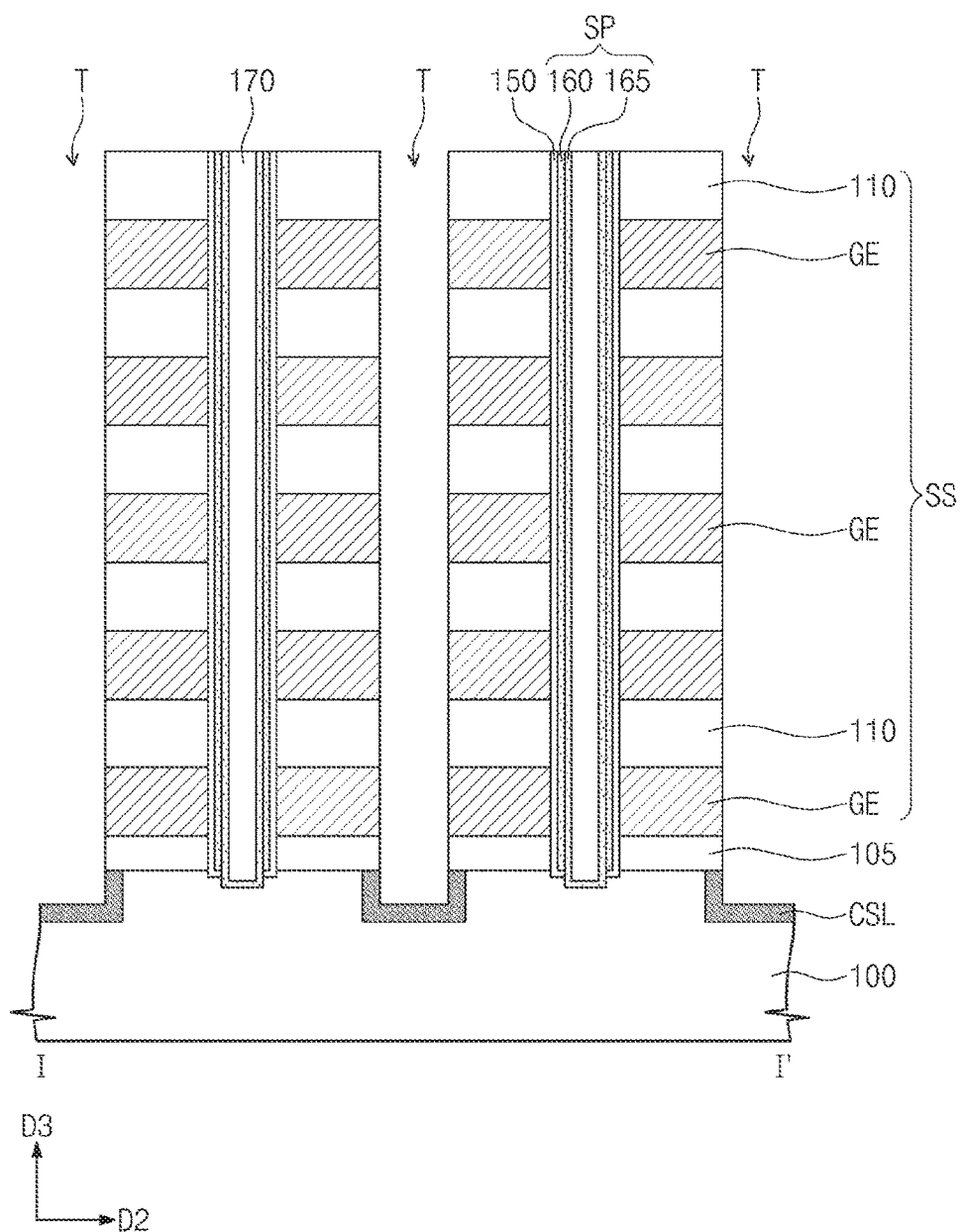
Figure 16:
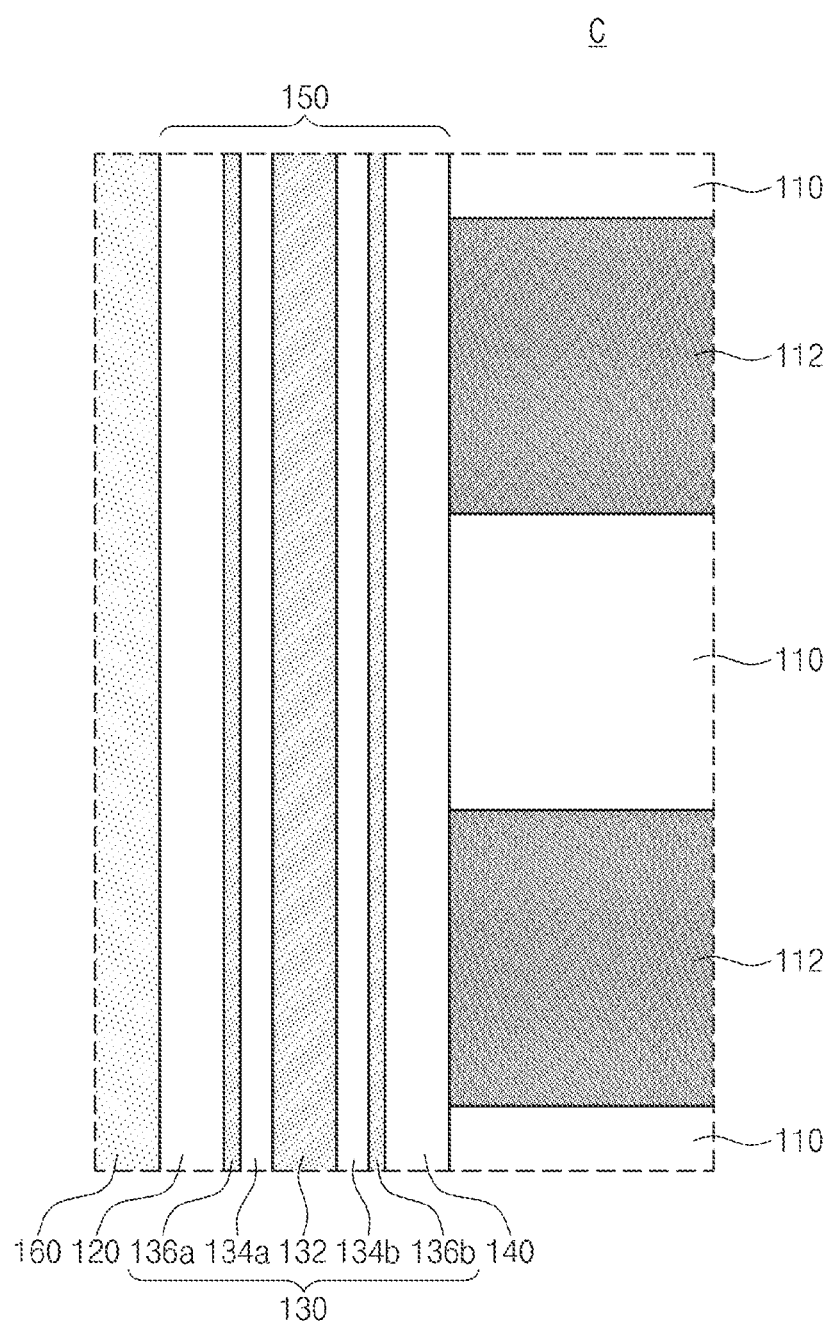
FIG. 16 is an enlarged view of a portion 'C' of FIG. 12.

Referring to FIG. 15, gate electrodes GE may be formed in the recess regions R, respectively. A conductive layer may be formed to fill the recess regions R, and the conductive layer in the trenches T may be removed to form the gate electrodes in the recess regions R, respectively. According to an embodiment, the conductive layer may fill the recess regions R and may conformally cover inner sidewalls of the trenches T. In this case, the conductive layer in the trenches T may be removed by an isotropic etching process. Alternatively, the conductive layer may also fill the trenches T. In this case, the conductive layer in the trenches T may be removed by an anisotropic etching process. The conductive layer may include a barrier metal layer and a metal layer which are sequentially deposited. The barrier metal layer may include a metal nitride layer such as titanium nitride (TiN), tantalum nitride (TaN), or tungsten nitride (WN). The metal layer may include a metal material such as tungsten (W), aluminum (Al), titanium (Ti), tantalum (Ta), cobalt (Co), and/or copper (Cu).

The gate electrodes GE and the insulating layers 110 disposed therebetween may constitute a stack structure SS.

After the formation of the gate electrodes GE, common source regions CSL may be formed in the substrate 100. The common source regions CSL may be formed by performing an ion implantation process on the substrate 100 exposed by the trenches T. A conductivity type of the common source regions CSL may be different from that of the substrate 100. In an embodiment, the common source regions CSL may be connected to each other to be in an equipotential state. In another embodiment, the common source regions CSL may be electrically isolated from each other, so different potentials may be applied to the common source regions CSL. In still another embodiment, the common source regions CSL may be divided into a plurality of source groups. Each of the source groups may include a plurality of the common source regions CSL. The source groups may be electrically isolated from each other, so different potentials may be applied to the source groups. The common source regions CSL included in one source group may be in an equipotential state.

Referring again to FIG. 9, an electrode isolation pattern 180 may be formed on the common source region CSL to fill the trench T. The electrode isolation pattern 180 may include a silicon oxide layer, a silicon nitride layer, and/or a silicon oxynitride layer.

Conductive pads 190 connected to the semiconductor patterns SP may be formed. Top ends of the first and second semiconductor patterns 160 and 165 may be recessed, and the recessed region may be filled with a conductive material to form the conductive pad 190. In an embodiment, the conductive pad 190 may be doped with dopants of a conductivity type different from that of the first and second semiconductor patterns 160 and 165. Thus, the conductive pad 190 and the semiconductor patterns 160 and 165 may constitute a diode.

Contact plugs PLG connected to the conductive pads 190 and bit lines BL connected to the contact plugs PLG may be formed on the stack structure SS. The bit line BL may be electrically connected to the semiconductor patterns SP through the contact plug PLG. The bit lines BL may intersect the gate electrodes GE and/or the trenches T. The bit lines BL may be spaced apart from the stack structure SS by an interlayer insulating layer 200.

Figure 17:
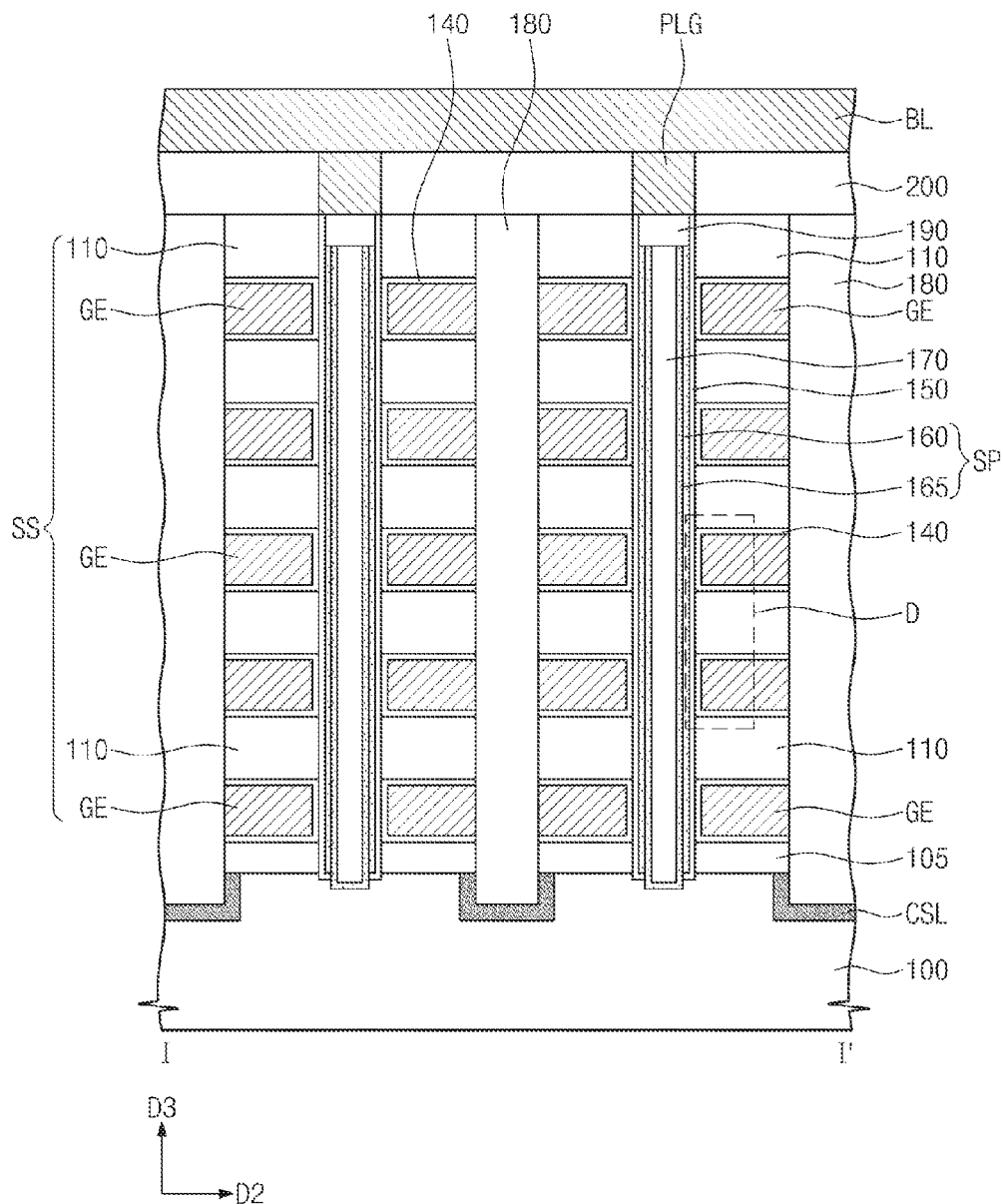
FIG. 17 is a cross-sectional view corresponding to line I-I' of FIG. 8 to illustrate a non-volatile memory device according to modified embodiments of the inventive concepts.
Figure 18:
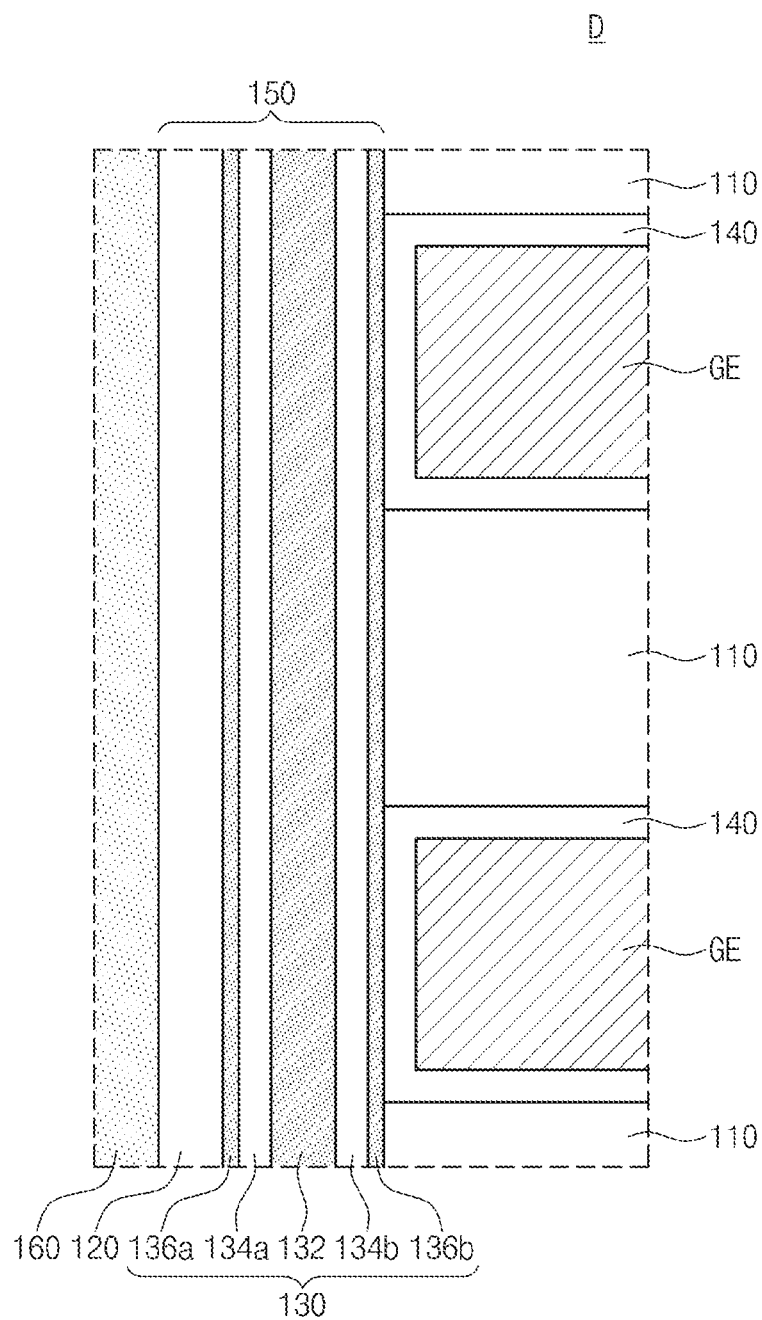
FIG. 18 is an enlarged view of a portion 'D' of FIG. 17.

FIG. 17 is a cross-sectional view corresponding to line I-I' of FIG. 8 to illustrate a non-volatile memory device according to a modified embodiment of the second embodiment of the inventive concepts. FIG. 18 is an enlarged view of a portion 'D' of FIG. 17. In the present example embodiment, the same elements as described in the second embodiment of FIGS. 8 to 10 will be indicated by the same reference numerals or the same reference designators. For the purpose of ease and convenience in explanation, the descriptions to the same elements in the second embodiment will be omitted or mentioned briefly. In other words, differences between the present example embodiment and the second embodiment will be mainly described hereinafter.

Referring to FIGS. 17 and 18, according to the present example embodiment, a blocking insulating layer 140 may be disposed on a top surface and a bottom surface of each of the gate electrodes GE. The blocking insulating layer 140 may extend into between each of the gate electrodes GE and the charge storage structure 150.

The charge storage structure 150 may include the tunnel insulating layer 120 and the charge storage layer 130 which are sequentially stacked between the first semiconductor pattern 160 and the blocking insulating layer 140 and between the first semiconductor pattern 160 and the insulating layer 110. In other words, according to the present embodiment, the charge storage structure 150 may not include the blocking insulating layer 140. In an example embodiment, the charge storage structure 150 may further include an additional blocking insulating layer (not shown), unlike FIG. 18.

Figure 19:
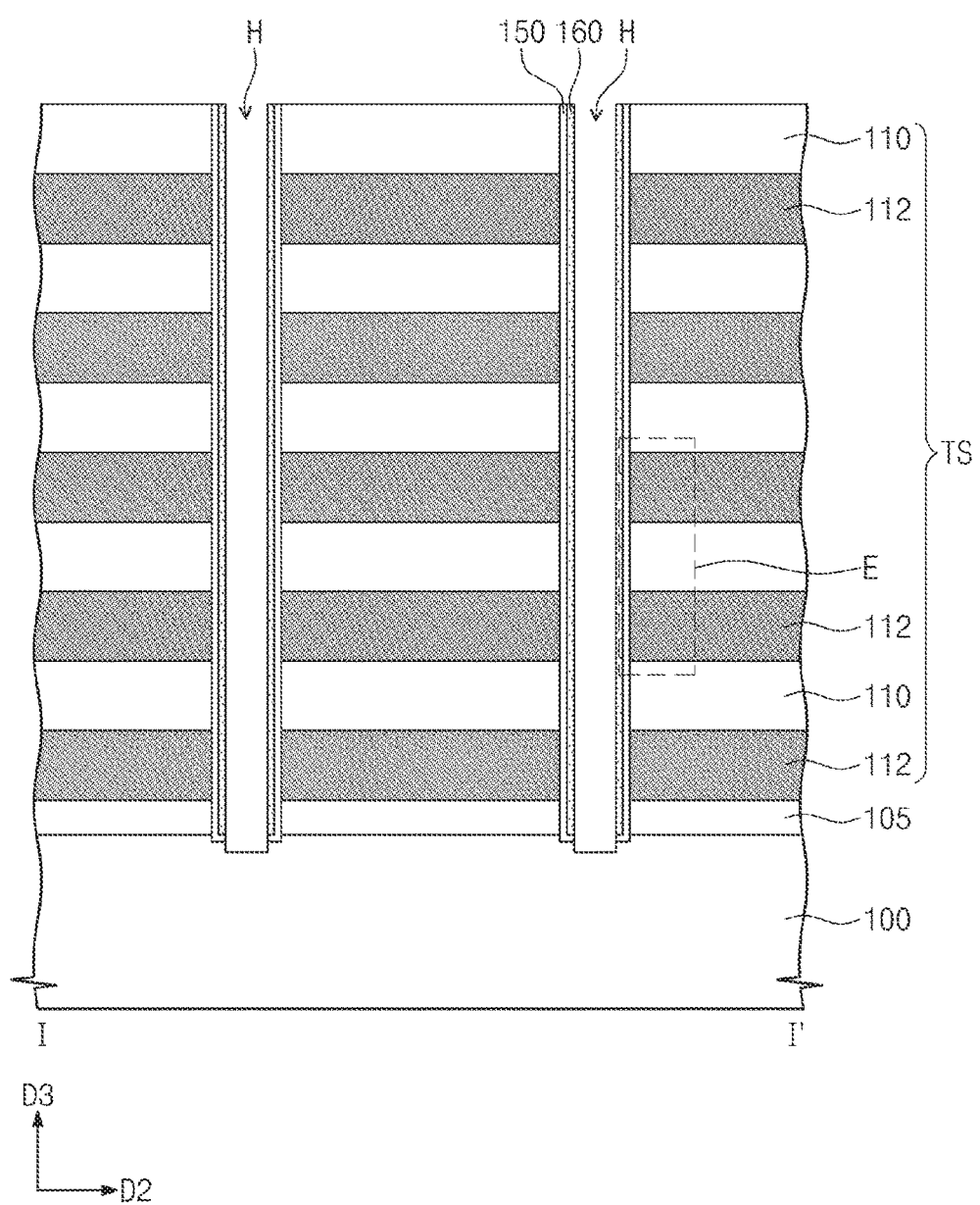
FIGS. 19 and 20 are cross-sectional views corresponding to line I-I' of FIG. 8 to illustrate a method of manufacturing the non-volatile memory device according to an embodiment of the inventive concepts.
Figure 20:
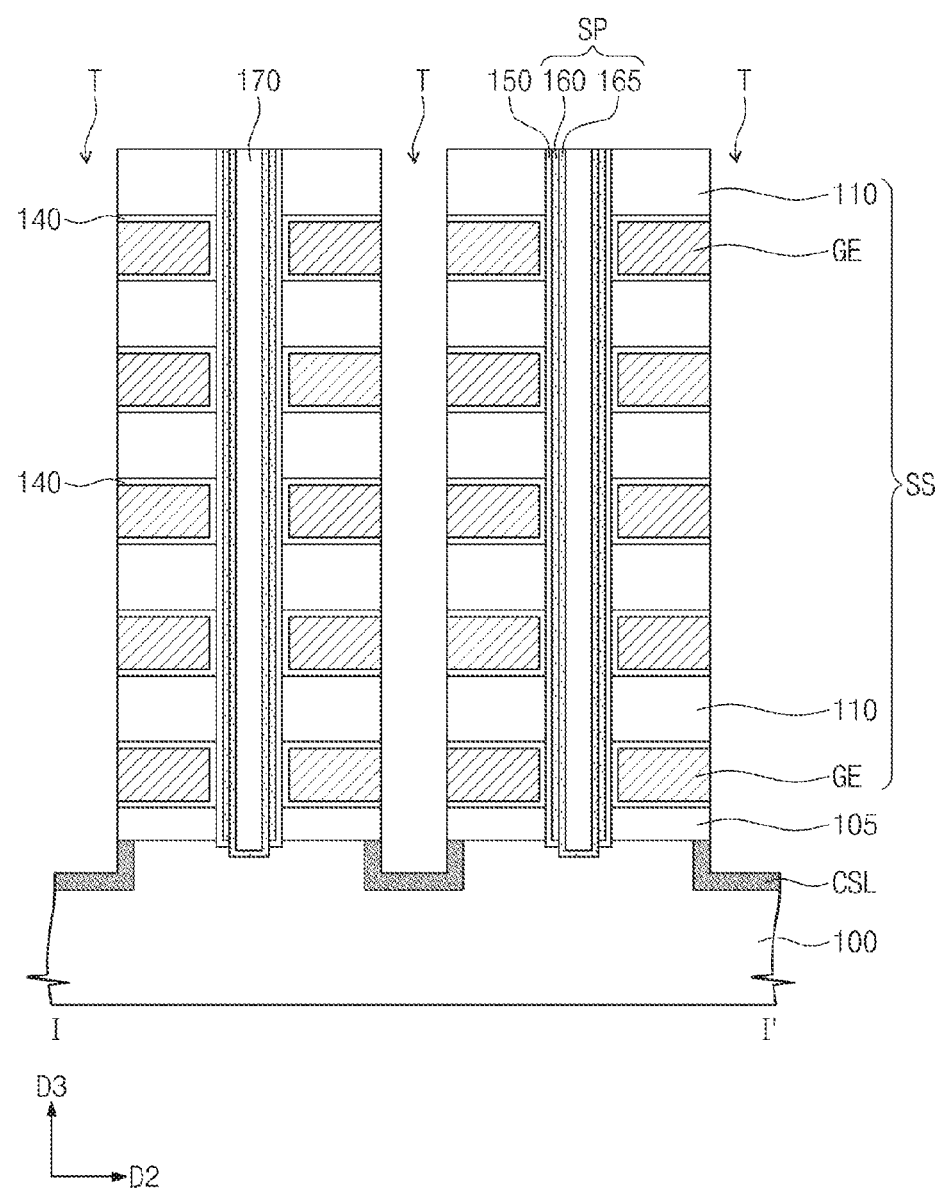
Figure 21:
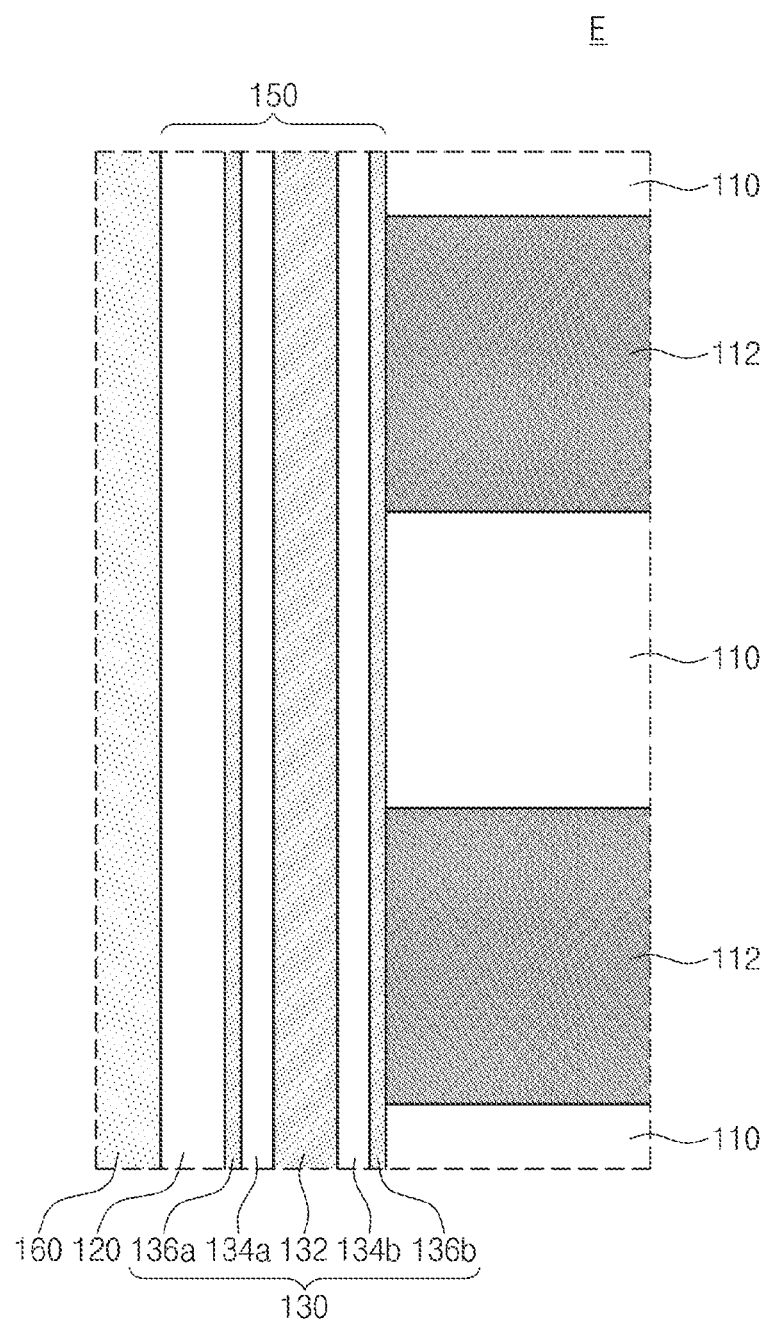
FIG. 21 is an enlarged view of a portion 'E' of FIG. 19.

FIGS. 19 and 20 are cross-sectional views corresponding to line I-I' of FIG. 8 to illustrate a method of manufacturing the non-volatile memory device according to the above-described embodiment the inventive concepts. FIG. 21 is an enlarged view of a portion 'E' of FIG. 19. In the present embodiment, the same elements as described in the manufacturing method according to the second embodiment of FIGS. 11 to 16 will be indicated by the same reference numerals or the same reference designators. For the purpose of ease and convenience in explanation, the descriptions to the same elements in the embodiment of FIGS. 11 to 16 will be omitted or mentioned briefly. In other words, differences between a manufacturing method of the present embodiment and the manufacturing method of the second embodiment will be mainly described hereinafter.

Referring to FIGS. 19 and 21, a charge storage structure 150 and a first semiconductor pattern 160 may be formed to cover the inner sidewall of each of the through-holes H and to expose the substrate 100.

In detail, a charge storage structure layer (not shown) and a first semiconductor layer (not shown) may be sequentially formed to cover the inner sidewalls of the through-holes H. The charge storage structure layer and the first semiconductor layer may partially fill each of the through-holes H. In other words, each of the through-holes H may not be completely filled with the charge storage structure layer and the first semiconductor layer. Thereafter, the first semiconductor layer and the charge storage structure layer may be anisotropically etched to expose the substrate 100. Thus, the charge storage structure 150 and the first semiconductor pattern 160 may be formed on the inner sidewall of each of the through-holes H. In other words, the charge storage structure 150 and the first semiconductor pattern 160 may have hollow cylindrical shapes having opened both ends.

As illustrated in FIG. 21, the charge storage structure 150 may include a tunnel insulating layer 120 and a charge storage layer 130 which are sequentially stacked between the first semiconductor pattern 160 and the thin-layer structure TS. The charge storage layer 130 and the tunnel insulating layer 120 may sequentially deposited on the inner sidewall of the through-hole H by a plasma-enhanced CVD technique, a physical CVD technique, or an ALD technique.

The charge storage layer 130 may include a first charge storage layer 132 disposed between the tunnel insulating layer 120 and the thin-layer structure TS, a second charge storage layer 134a disposed between the tunnel insulating layer 120 and the first charge storage layer 132, and a third charge storage layer 134b disposed between the thin-layer structure TS and the first charge storage layer 132. In addition, the charge storage layer 130 may further include a fourth charge storage layer 136a disposed between the tunnel insulating layer 120 and the second charge storage layer 134a and a fifth charge storage layer 136b disposed between the thin-layer structure TS and the third charge storage layer 134b. Forming the charge storage layer 130 may include sequentially depositing the fifth charge storage layer 136b, the third charge storage layer 134b, the first charge storage layer 132, the second charge storage layer 134a, and the fourth charge storage layer 136a on the inner sidewall of the through-hole H by a plasma-enhanced CVD technique, a physical CVD technique, or an ALD technique.

Thereafter, a second semiconductor pattern 165 and a filled insulation pattern 170 may be formed to fill the rest region of each of the through-holes H, as described with reference to FIGS. 13 and 14. Next, the thin-layer structure TS may be patterned to form trenches T exposing the substrate 100 between the through-holes H.

The trenches T may be spaced apart from the semiconductor patterns SP to expose sidewalls of the sacrificial layers 112 and sidewalls of the insulating layers 110. The sacrificial layers 112 exposed by the trenches T may be removed to form recess regions R between the insulating layers 110. The recess regions R may horizontally extend from the trench T into between the insulating layers 110 and between the lower insulating layer 105 and the lowermost one of the insulating layers 110. Each of the recess regions R may expose a portion of a sidewall of the charge storage structure 150.

Referring to FIG. 20, a blocking insulating layer 140 and a gate electrode GE may be formed in each of the recess regions R. The blocking insulating layer 140 may cover an inner surface of the recess region R, and the gate electrode GE may fill the rest space of the recess region R. For example, the blocking insulating layer 140 and a conductive layer may be formed to sequentially cover the inner surfaces of the recess regions R, and the blocking insulating layer 140 and the conductive layer disposed in the trenches T may be removed to locally form the blocking insulating layer 140 and the gate electrode GE in each of the recess regions R. The gate electrodes GE and the insulating layers interposed therebetween may constitute a stack structure SS.

Common source regions CSL may be formed in the substrate 100 after the formation of the gate electrodes GE.

Subsequent processes may be the substantially same as the processes described with reference to FIG. 9.

Figure 22:
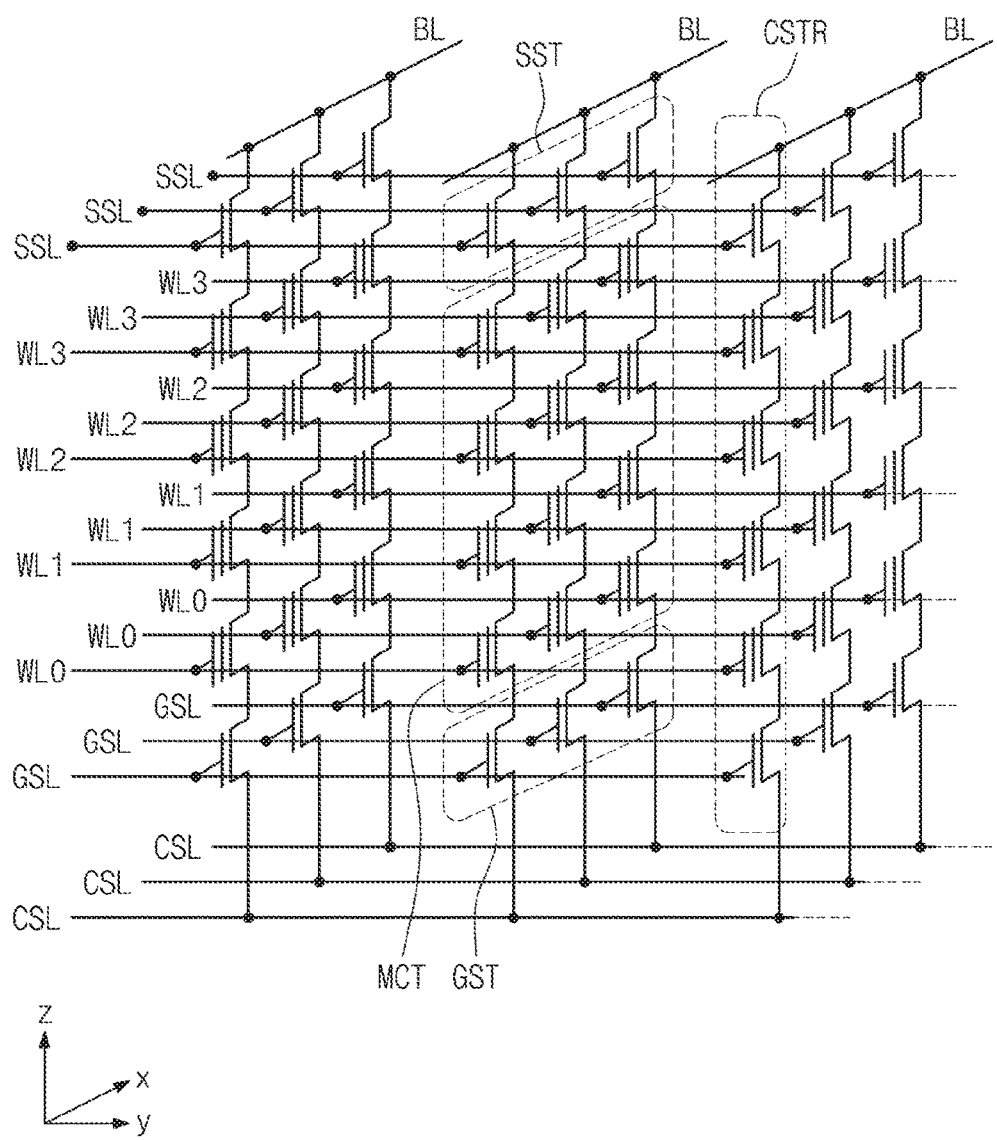
FIG. 22 is a schematic circuit diagram illustrating a cell array of the non-volatile memory device according to embodiments of the inventive concepts.

FIG. 22 is a schematic circuit diagram illustrating a cell array of the non-volatile memory device according to the second embodiment of the inventive concepts. The schematic circuit diagram of FIG. 22 may be applied to the non-volatile memory device illustrated in FIGS. 17 and 18.

Referring to FIG. 22, a cell array of a three-dimensional (3D) non-volatile memory device may include a common source line CSL, a plurality of bit lines BL, and a plurality of cell strings CSTR disposed between the common source line CSL and the bit lines BL.

The common source line CSL may be a conductive thin layer formed on a substrate or a dopant region formed in the substrate. The bit lines BL may be conductive patterns (e.g., metal lines) that are disposed over the substrate. The bit lines BL may be two-dimensionally arranged and a plurality of the cell strings CSTR may be connected in parallel to each of the bit lines BL. The cell strings CSTR may be connected in common to the common source line CSL. In other words, a plurality of the cell strings CSTR may be disposed between the common source line CSL and a plurality of the bit lines BL. In an embodiment, the common source line CSL may be provided in plurality, and the plurality of common source lines CSL may be two-dimensionally arranged. The common source lines CSL may be supplied with the same voltage. Alternatively, the common source lines CSL may be controlled independently of each other.

Each of the cell strings CSTR may include a ground selection transistor GST connected to the common source line CSL, a string selection transistor SST connected to the bit line BL, and a plurality of memory cell transistors MCT disposed between the ground and string selection transistors GST and SST. The ground selection transistor GST, the memory cell transistors MCT, and the string selection transistor SST may be connected in series in the order named.

The common source lines CSL may be connected in common to sources of the ground selection transistors GST of the cell strings CSTR. A ground selection line GSL, a plurality of word lines WL0 to WL3 and a string selection line SSL which are disposed between the common source line CSL and the bit lines may be used as gate electrodes of the ground selection transistor GST, the memory cell transistors MCT and the string selection transistor SST, respectively. Each of the memory cell transistors MCT may include a data storage element.

Figure 23:
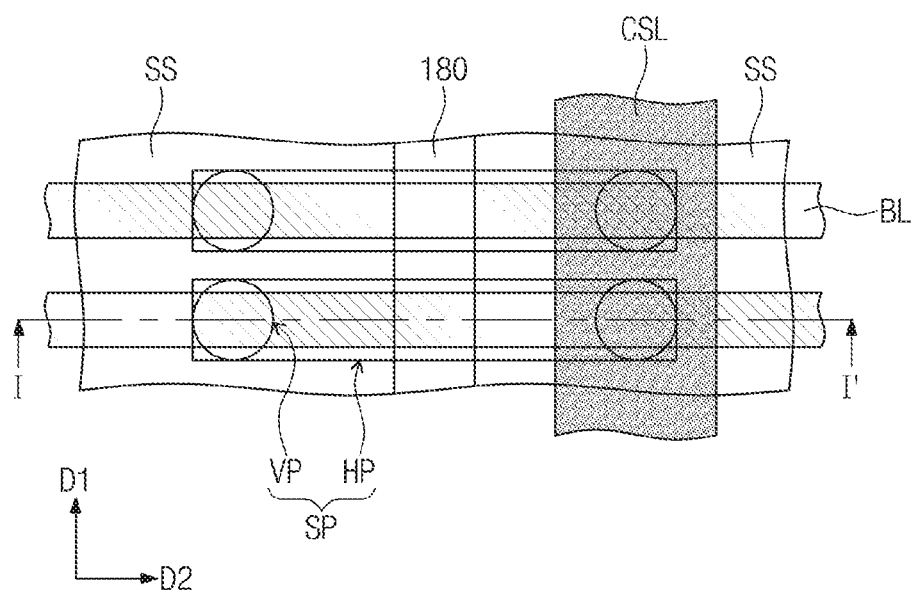
FIG. 23 is a plan view illustrating a non-volatile memory device according to an embodiment of the inventive concepts.
Figure 24:
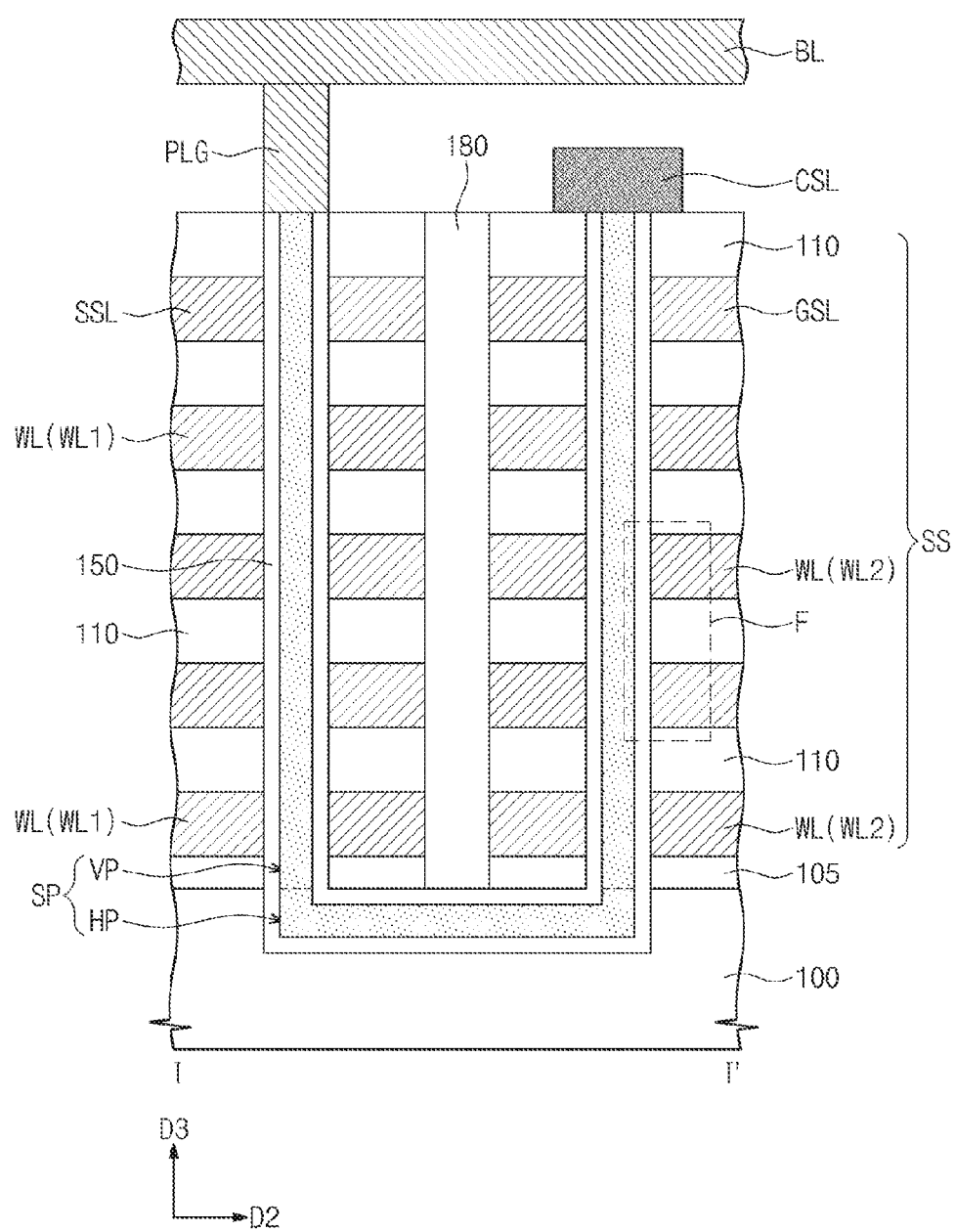
FIG. 24 is a cross-sectional view taken along line I-I' of FIG. 23.
Figure 25:
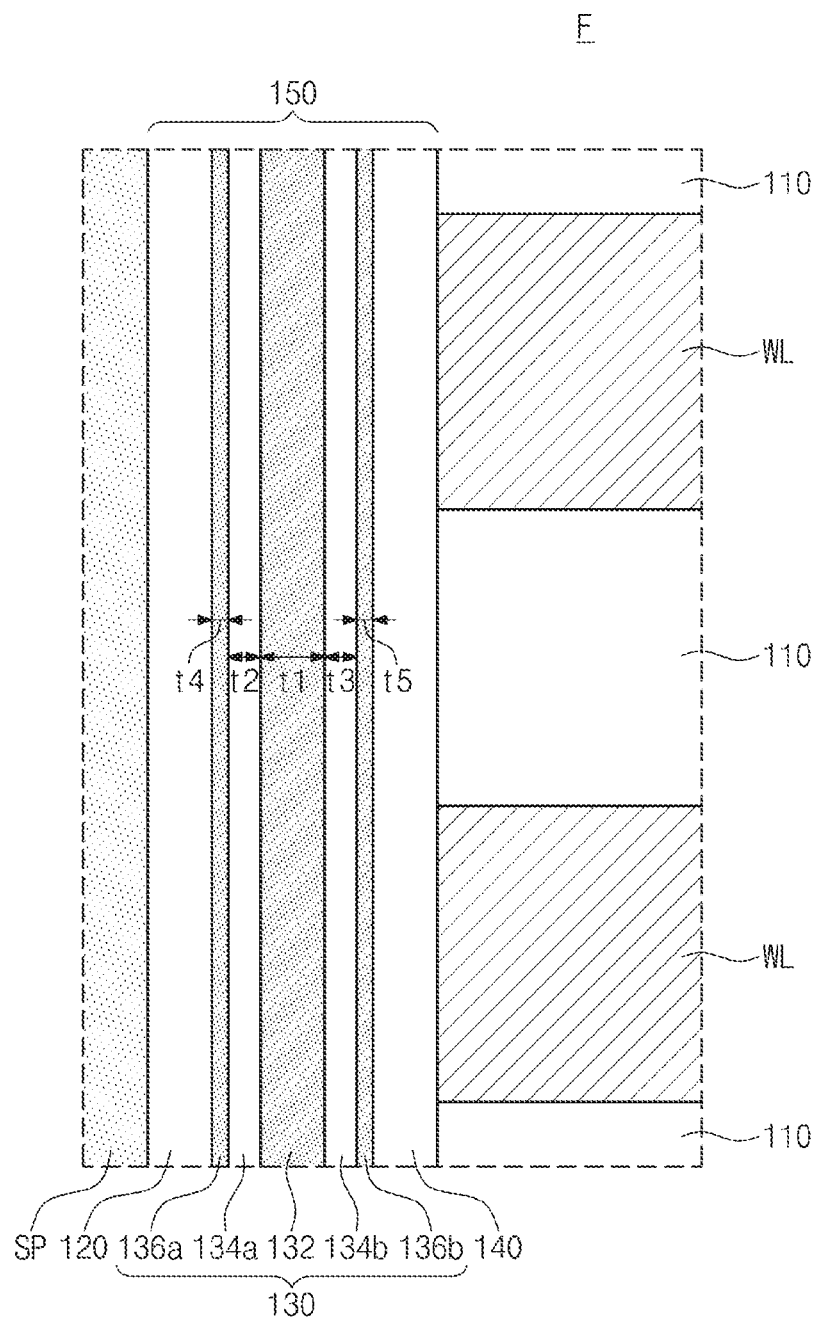
FIG. 25 is an enlarged view of a portion 'F' of FIG. 24.

FIG. 23 is a plan view illustrating a non-volatile memory device according to a third embodiment of the inventive concepts, and FIG. 24 is a cross-sectional view taken along line I-I' of FIG. 23. FIG. 25 is an enlarged view of a portion 'F' of FIG. 24. In the present embodiment, the same elements as described in the second embodiment of FIGS. 8 to 10 will be indicated by the same reference numerals or the same reference designators. For the purpose of ease and convenience in explanation, the descriptions to the same elements in the second embodiment will be omitted or mentioned briefly.

Referring to FIGS. 23 to 25, a non-volatile memory device may include a bit line BL on a substrate 100, a stack structure SS between the substrate 100 and the bit line BL, a common source line CSL between the stack structure SS and the bit line BL, and a semiconductor pattern SP penetrating the stack structure SS. The semiconductor pattern SP may be connected between the bit line BL and the common source line CSL. The semiconductor pattern SP may be connected to the bit line BL through a contact plug PLG provided between the stack structure SS and the bit line BL.

The stack structure SS may include word lines WL sequentially stacked on the substrate 100, and selection lines disposed between the word lines WL and the bit line BL. The selection lines may include a string selection line SSL disposed between the bit line BL and the word lines WL and a ground selection line GSL disposed between the common source line CSL and the word lines WL.

According to an embodiment, the word lines WL, the string selection line SSL, and the ground selection line GSL may extend in a first direction D1 when viewed from a plan view. The string selection line SSL and the ground selection line GSL may be spaced apart from each other in a second direction D2 intersecting the first direction D1. The word lines WL may include upper word lines WL1 disposed between the substrate 100 and the string selection line SSL, and lower word lines WL2 disposed between the substrate 100 and the ground selection line GSL. The upper word lines WL1 may be spaced apart from the lower word lines WL2 in the second direction D2.

An electrode isolation pattern 180 may be provided between the string selection line SSL and the ground selection line GSL and between the upper word lines WL1 and the lower word lines WL2. The electrode isolation pattern 180 may have a linear shape extending in the first direction D1. The electrode isolation pattern 180 may include at least one of, but not limited to, a silicon oxide layer, a silicon nitride layer, or a silicon oxynitride layer.

The semiconductor pattern SP may include a pair of vertical portions VP penetrating the stack structure SS, and a horizontal portion HP provided under the stack structure SS to connect the pair of vertical portions VP to each other. One of the pair of vertical portions VP may penetrate the stack structure SS so as to be connected to the common source line CSL, and the other of the pair of vertical portions VP may penetrate the stack structure SS so as to be connected to the bit line BL. The horizontal portion HP may be provided between the substrate 100 and the stack structure SS so as to be connected between the pair of vertical portions VP.

In more detail, the one of the pair of vertical portions VP may penetrate the lower word lines WL2 and the ground selection line GSL so as to be connected to the common source line CSL, and the other of the pair of vertical portions VP may penetrate the upper word lines WL1 and the string selection line SSL so as to be connected to the bit line BL through the contact plug PLG. The horizontal portion HP may extend from under the upper word lines WL1 to under the lower word lines WL2 to connect the pair of vertical portions VP to each other. As illustrated in FIG. 23, the horizontal portion HP may have a plate shape intersecting the electrode isolation pattern 180 when viewed from a plan view.

The semiconductor pattern SP may include a semiconductor material. For example, the semiconductor pattern SP may include silicon (Si), germanium (Ge), or a mixture thereof. The semiconductor pattern SP may include a semiconductor material doped with dopants or an undoped semiconductor material (e.g., an intrinsic semiconductor material). The semiconductor pattern SP may have at least one of a single-crystalline structure, an amorphous structure, or a poly-crystalline structure. The semiconductor pattern SP may be undoped or may be doped with dopants of the same conductivity type as the substrate 100.

A charge storage structure 150 may be disposed between the semiconductor pattern SP and the stack structure SS. The charge storage structure 150 may extend into between the semiconductor pattern SP and the substrate 100. As illustrated in FIG. 25, the charge storage structure 150 may include a tunnel insulating layer 120, a charge storage layer 130, and a blocking insulating layer 140 which sequentially stacked on an outer sidewall of the semiconductor pattern SP. In some embodiments, as illustrated in FIG. 25, the charge storage structure 150 may continuously cover the outer sidewall of the semiconductor pattern SP. Unlike 25, a portion (e.g., the blocking insulating layer 140) of the charge storage structure 150 may be disposed between the semiconductor pattern SP and each of the lines WL, SSL, and GSL and may extend in the second direction D2 to cover a top surface and a bottom surface of each of the lines WL, SSL, and GSL.

The charge storage layer 130 may include a first charge storage layer 132 disposed between the tunnel insulating layer 120 and the blocking insulating layer 140, a second charge storage layer 134a disposed between the tunnel insulating layer 120 and the first charge storage layer 132, and a third charge storage layer 134b disposed between the blocking insulating layer 140 and the first charge storage layer 132. In addition, the charge storage layer 130 may further include a fourth charge storage layer 136a disposed between the tunnel insulating layer 120 and the second charge storage layer 134a and a fifth charge storage layer 136b disposed between the blocking insulating layer 140 and the third charge storage layer 134b.

As described with reference to FIG. 4, the first, second, third, fourth, and fifth charge storage layers 132, 134a, 134b, 136a, and 136b may have a first energy band gap Eg1, a second energy band gap Eg2, a third energy band gap Eg3, a fourth energy band gap Eg4, and a fifth energy band gap Eg5, respectively. The first energy band gap Eg1 may be smaller than the second energy band gap Eg2 and the third energy band gap Eg3. The fourth energy band gap Eg4 may be smaller than the second energy band gap Eg2, and the fifth energy band gap Eg5 may be smaller than the third energy band gap Eg3. According to an embodiment, the second charge storage layer 134a and the third charge storage layer 134b may have the same conduction band energy level Ec as each other and may have the same valance band energy level Ev as each other. In addition, the fourth charge storage layer 136a and the fifth charge storage layer 136b may have the same conduction band energy level Ec as each other and may have the same valance band energy level Ev as etch other. Moreover, the first charge storage layer 132 may have the same conduction band energy level Ec and the same valance band energy level Ev as the fourth and fifth charge storage layers 136a and 136b. The first to fifth energy band gaps Eg1, Eg2, Eg3, Eg4, and Eg5 may be smaller than energy band gaps of the tunnel insulating layer 120 and the blocking insulating layer 140.

As illustrated in FIG. 25, the first, second, third, fourth, and fifth charge storage layers 132, 134a, 134b, 136a, and 136b may have a first thickness t1, a second thickness t2, a third thickness t3, a fourth thickness t4, and a fifth thickness t5 in the second direction D2, respectively. The first thickness t1 may be greater than the second thickness t2 and the third thickness t3. According to an embodiment, the second thickness t2 and the third thickness t3 may be substantially equal to each other. The fourth thickness t4 may be substantially equal to or smaller than the second thickness t2. The fifth thickness t5 may be substantially equal to or smaller than the third thickness t3.

A nitrogen concentration in the first charge storage layer 132 may be higher than a nitrogen concentration in the second charge storage layer 134a and a nitrogen concentration in the third charge storage layer 134b. A nitrogen concentration in the fourth charge storage layer 136a may be higher than the nitrogen concentration in the second charge storage layer 134a, and a nitrogen concentration in the fifth charge storage layer 136b may be higher than the nitrogen concentration in the third charge storage layer 134b. An oxygen concentration in the first charge storage layer 132 may be lower than an oxygen concentration in the second charge storage layer 134a and an oxygen concentration in the third charge storage layer 134b. An oxygen concentration in the fourth charge storage layer 136a may be lower than the oxygen concentration in the second charge storage layer 134a, and an oxygen concentration in the fifth charge storage layer 136b may be lower than the oxygen concentration in the third charge storage layer 134b. In an embodiment, the first charge storage layer 132, the fourth charge storage layer 136a, and the fifth charge storage layer 136b may include silicon nitride (SiN), and the second and third charge storage layers 134a and 134b may include silicon oxynitride (SiON).

The word lines WL1 and WL2 may be configured to control a potential of the semiconductor pattern SP. For example, electrical connection between the bit line BL and the common source line CSL may be controlled by the word lines WL1 and WL2, the string selection line SSL, and the ground selection line GSL. Thus, the semiconductor pattern SP may form a unit cell string of a NAND-type cell array structure.

Even though not shown in the drawings, a switching component (not shown) may be provided in the substrate 100 to control a flow of charges passing through the horizontal portion HP of the semiconductor pattern SP.

FIGS. 26 to 29 are cross-sectional views corresponding to line I-I' of FIG. 23 to illustrate a method of manufacturing the non-volatile memory device according to the third embodiment of the inventive concepts. In the present embodiment, the same elements as described in the manufacturing method according to the second embodiment of FIGS. 11 to 16 will be indicated by the same reference numerals or the same reference designators. For the purpose of ease and convenience in explanation, the descriptions to the same elements in the embodiment of FIGS. 11 to 16 will be omitted or mentioned briefly.

Figure 26:
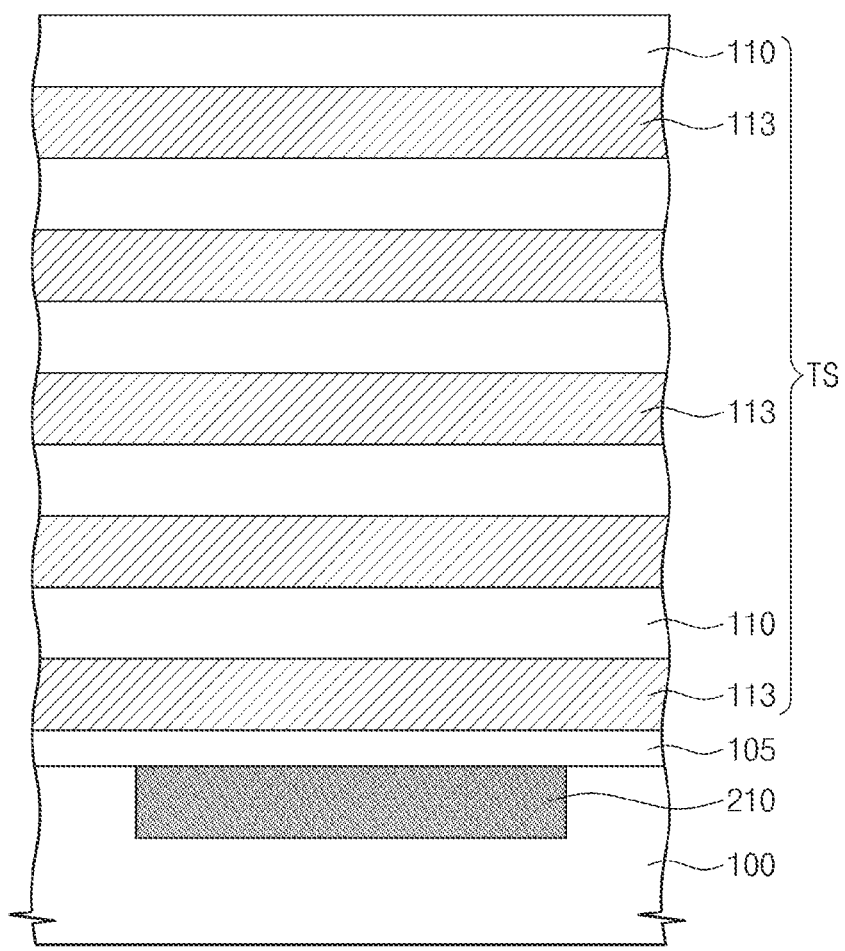
FIGS. 26, 27, 28 and 29 are cross-sectional views corresponding to line I-I' of FIG. 23 to illustrate a method of manufacturing the non-volatile memory device according to embodiments of the inventive concepts.

Referring to FIG. 26, a buried sacrificial pattern 210 may be formed in a substrate 100. A lower insulating layer 105 may be formed on the substrate 100 having the buried sacrificial pattern 210, and a thin-layer structure TS may be formed on the lower insulating layer 105. The thin-layer structure TS may include a plurality of insulating layers 110 and a plurality of conductive layers 113 which are alternately and repeatedly stacked. The substrate 100 may include a semiconductor material (e.g., a silicon substrate).

The buried sacrificial pattern 210 may be formed of a material having an etch selectivity with respect to the insulating layers 110 and the conductive layers 113. The buried sacrificial pattern 210 may be formed by, for example, a process of forming an insulating pattern used for device isolation.

Figure 27:
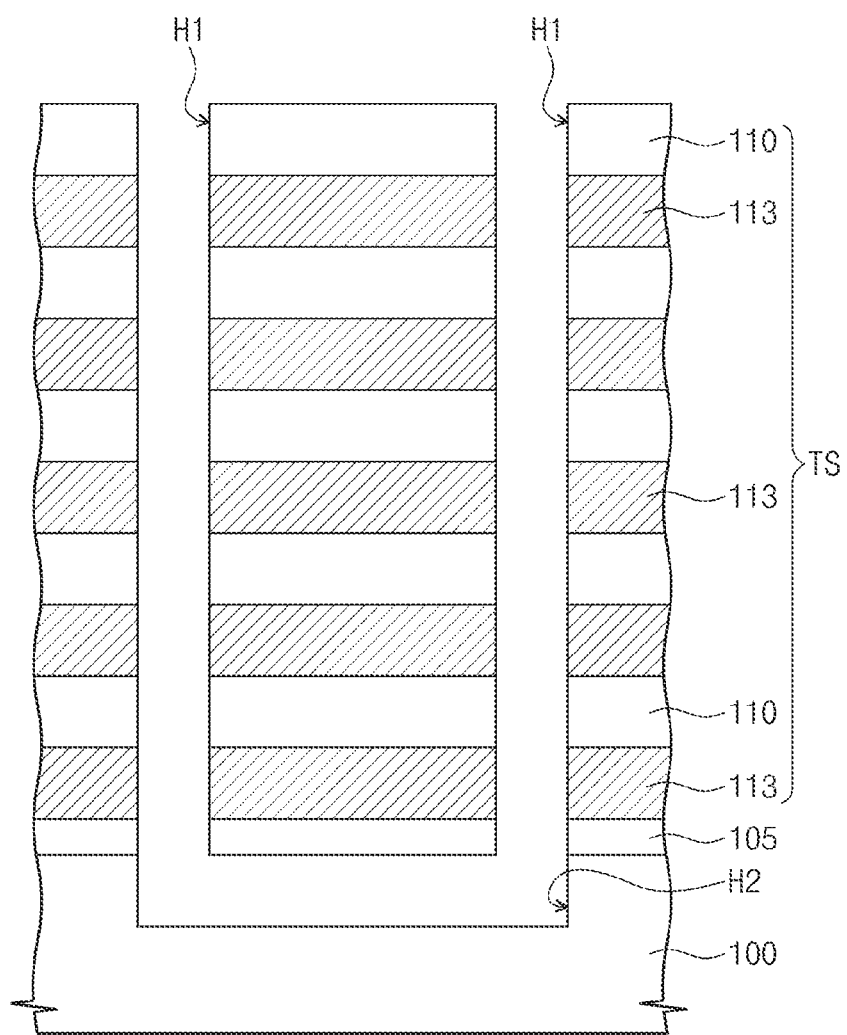

Referring to FIG. 27, vertical holes H1 may be formed to penetrate the thin-layer structure TS. The vertical holes H1 may expose a top surface of the buried sacrificial pattern 210. Thereafter, the buried sacrificial pattern 210 exposed by the vertical holes H1 may be selectively removed to form a horizontal hole H2. A pair of the vertical holes H1 may be formed on one buried sacrificial pattern 210. The pair of vertical holes H1 may be connected to each other through the horizontal hole H2. One opening penetrating the thin-layer structure TS may be defined by the pair of vertical holes H1 and the horizontal hole H2 connected to each other.

Figure 28:
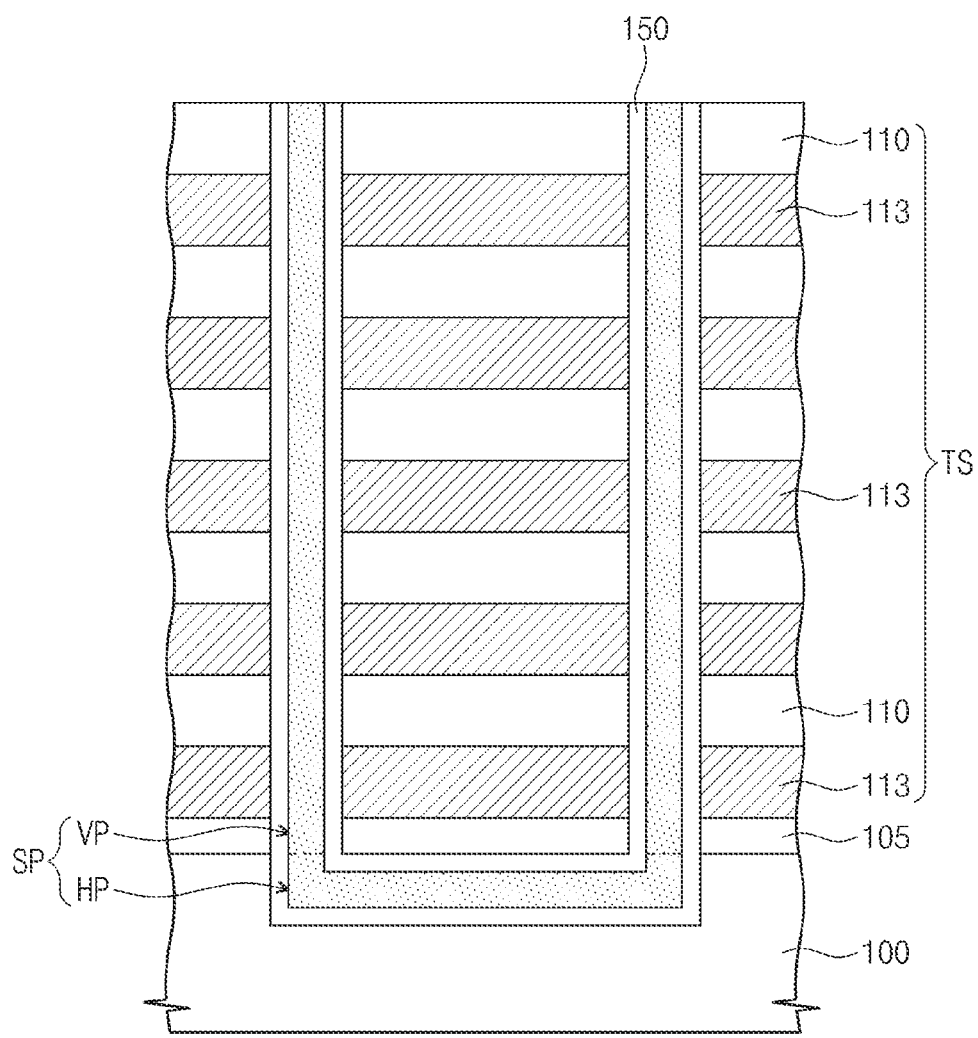

Referring to FIG. 28, a charge storage structure 150 may be formed to conformally cover an inner surface of the opening. The charge storage structure 150 may include a blocking insulating layer 140, a charge storage layer 130, and a tunnel insulating layer 120 which sequentially cover the inner surface of the opening, as described with reference to FIG. 25. The charge storage layer 130 may include a first charge storage layer 132 disposed between the tunnel insulating layer 120 and the blocking insulating layer 140, a second charge storage layer 134a disposed between the tunnel insulating layer 120 and the first charge storage layer 132, and a third charge storage layer 134b disposed between the blocking insulating layer 140 and the first charge storage layer 132. In addition, the charge storage layer 130 may further include a fourth charge storage layer 136a disposed between the tunnel insulating layer 120 and the second charge storage layer 134a and a fifth charge storage layer 136b disposed between the blocking insulating layer 140 and the third charge storage layer 134b.

Next, a semiconductor pattern SP may be formed to fill the rest region of the opening. The semiconductor pattern SP may include a pair of vertical portions VP respectively provided in the pair of vertical holes H1, and a horizontal portion HP provided in the horizontal hole H2.

Figure 29:
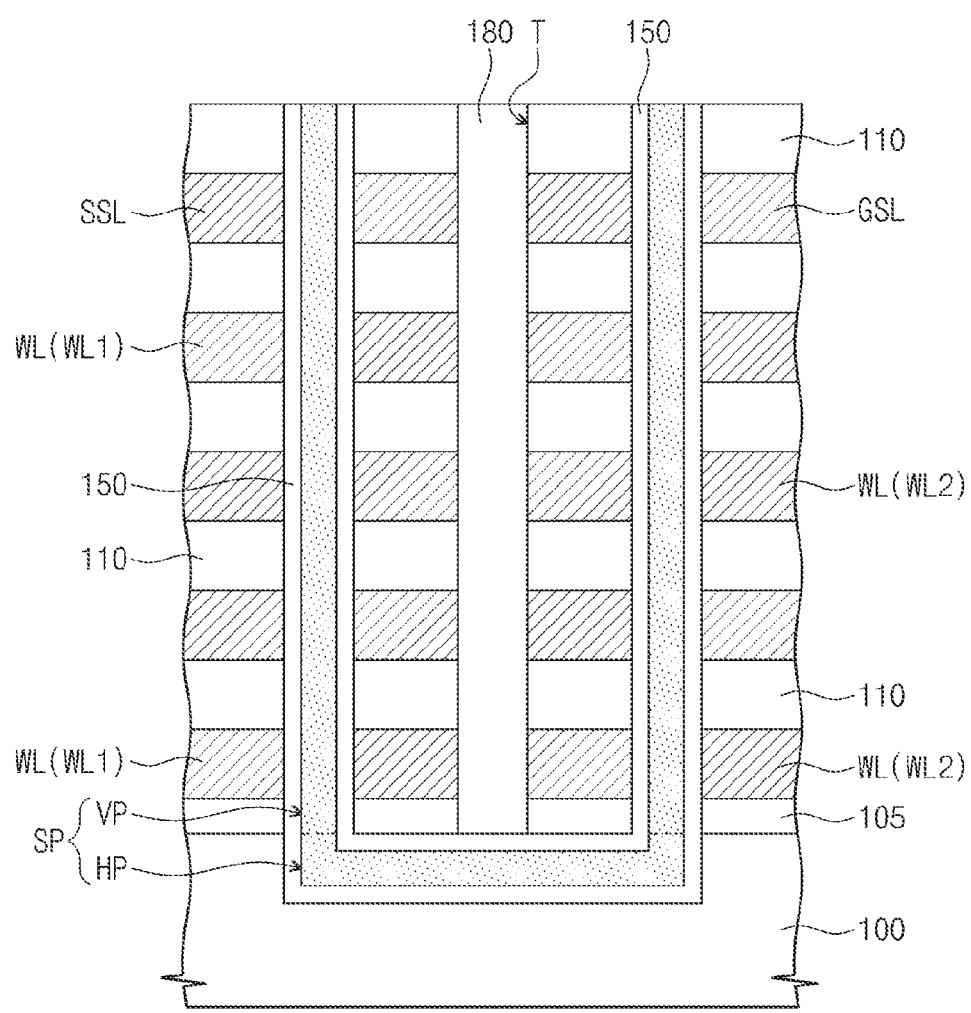

Referring to FIG. 29, the thin-layer structure TS may be patterned to form a trench T exposing inner sidewalls of the insulating layers 110 and inner sidewalls of the conductive layers 113. The trench T may intersect the horizontal portion HP of the semiconductor pattern SP. The trench T may be formed between the pair of vertical portions VP of the semiconductor pattern SP. The trench T may expose a portion of a top surface of the charge storage structure 150 surrounding an outer surface of the horizontal portion HP. Subsequently, an electrode isolation pattern 180 may be formed to fill the trench T.

By the formation of the trench T, the conductive layers 113 may be divided into conductive patterns. The uppermost conductive patterns of the conductive patterns may be used as a string selection line SSL and a ground selection line GSL of a cell array of a non-volatile memory device. The string selection line SSL and the ground selection line GSL may be spaced apart from each other with the electrode isolation pattern 180 interposed therebetween. The conductive patterns disposed between the string selection line SSL and the substrate 100 may be defined as upper word lines WL1, and the conductive patterns between the ground selection line GSL and the substrate 100 may be defined as lower word lines WL2. The upper word lines WL1 may be spaced apart from the lower word lines WL2 with the electrode isolation pattern 180 interposed therebetween. The word lines WL1 and WL2, the string selection line SSL, the ground selection line GSL, and the insulating layers 110 which are stacked on the substrate 100 may be defined as a stack structure SS.

One of the pair of vertical portions VP of the semiconductor pattern SP may penetrate the upper word lines WL1 and the string selection line SSL, and the other of the pair of vertical portions VP may penetrate the lower word lines WL2 and the ground selection line GSL. The horizontal portion HP of the semiconductor pattern SP may be provided under the stack structure SS to electrically connect the pair of vertical portions VP to each other.

Referring again to FIG. 24, a bit line BL may be formed on the stack structure SS, and a common source line CSL may be formed between the stack structure SS and the bit line BL. One of the pair of vertical portions VP of the semiconductor pattern SP may be connected to the bit line through a contact plug PLG, and the other of the pair of vertical portions VP may be connected to the common source line CSL.

Figure 30:
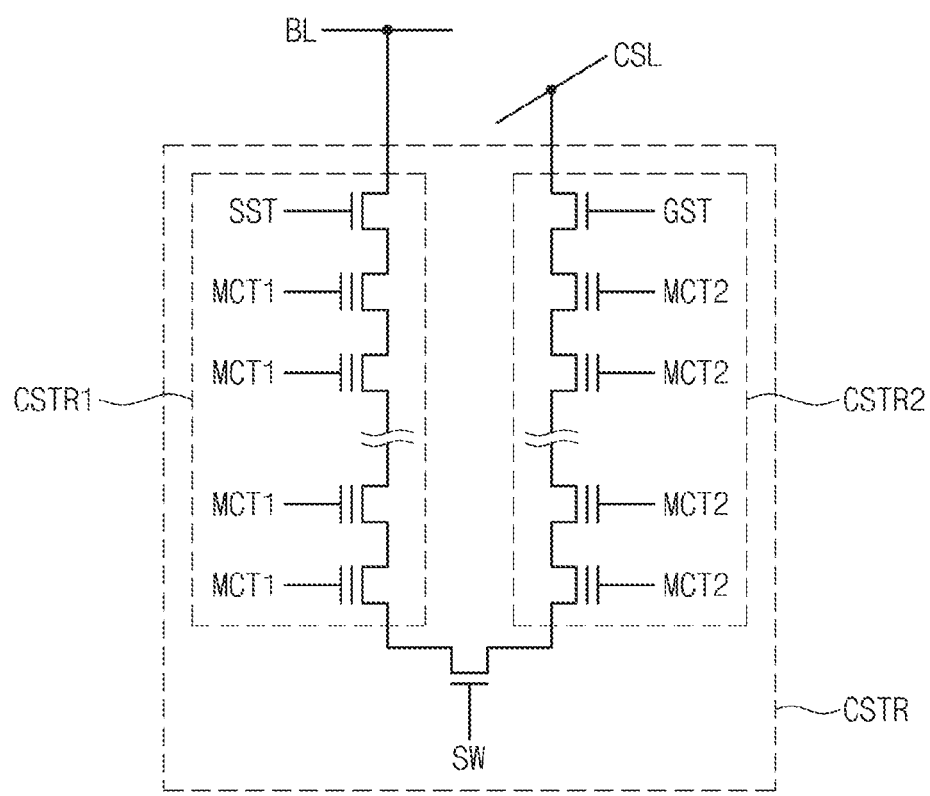
FIG. 30 is a schematic circuit diagram illustrating a cell array of the non-volatile memory device according to embodiments of the inventive concepts.

FIG. 30 is a schematic circuit diagram illustrating a cell array of the non-volatile memory device according to the third embodiment of the inventive concepts.

Referring to FIG. 30, a cell array of a non-volatile memory device may include a common source line CSL, a bit line BL, and a cell string CSTR between the common source line CSL and the bit line BL.

The common source line CSL may be a first conductive pattern disposed over a substrate, and the bit line BL may be a second conductive pattern (e.g., a metal line) disposed over the substrate.

The cell string CSTR may include an upper string CSTR1 connected to the bit line BL and a lower string CSTR2 connected to the common source line CSL. The upper string CSTR1 may be connected to the lower string CSTR2 through a switching component SW.

The upper string CSTR1 may include a string selection transistor SST connected to the bit line BL and a plurality of upper memory cell transistors MCT1 disposed between the string selection transistor SST and the switching component SW. The string selection transistor SST and the upper memory cell transistors MCT1 may be connected in series. The lower string CSTR2 may include a ground selection transistor GST connected to the common source line CSL and a plurality of lower memory cell transistors MCT2 disposed between the ground selection transistor GST and the switching component SW. The ground selection transistor GST and the lower memory cell transistors MCT2 may be connected in series. Each of the upper and lower memory cell transistors MCT1 and MCT2 may include a data storage element. For example, the data storage element may correspond to the charge storage structure described above.

According to embodiments of the inventive concepts, the charge storage layer may include the first charge storage layer, and the second and third charge storage layers spaced apart from each other with the first charge storage layer interposed therebetween. The energy band gap of the first charge storage layer may be smaller than those of the second and third charge storage layers, and the first charge storage layer may be thicker than the second and third charge storage layers. Thus, after the erase operation of the non-volatile memory device, the holes in the charge storage layer may be widely distributed at a low density along the valance band of the first charge storage layer. In this case, even though a long time elapses after the erase operation, the lateral spreading of the holes in the first charge storage layer may be minimized In other words, the increase of the residual holes in the charge storage layer may be minimized Thus, it is possible to minimize the loss of the electrons which may be caused by the residual holes of the charge storage layer.

In addition, the charge storage layer may further include the fourth and fifth charge storage layers which are spaced apart from each other with the first to third charge storage layers interposed therebetween. The energy band gaps of the fourth and fifth charge storage layers may be smaller than those of the second and third charge storage layers, respectively. In this case, a plurality of energy barriers may be generated in the charge storage layer, so it is possible to inhibit the electrons in the charge storage layer from moving to layers adjacent to the charge storage layer. In other words, the loss of the electrons of the charge storage layer may be minimized As a result, the charge retention characteristic and the reliability of the non-volatile memory device may be improved.

Figure 31:
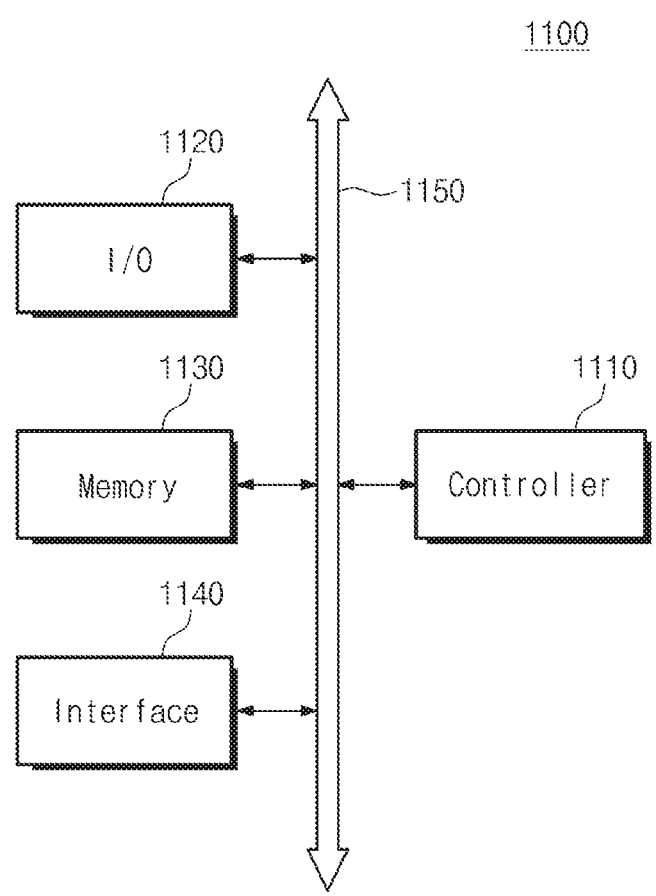
FIG. 31 is a schematic block diagram illustrating an example embodiment of a memory system including a non-volatile memory device according to example embodiments of the inventive concepts.

FIG. 31 is a schematic block diagram illustrating an example embodiment of a memory system including a non-volatile memory device according to example embodiments of the inventive concepts.

Referring to FIG. 31, a memory system 1100 may be applied to a personal digital assistant (PDA), a portable computer, a web tablet, a wireless phone, a mobile phone, a digital music player, a memory card, or other electronic products receiving and/or transmitting information data by wireless.

The memory system 1100 may include a controller 1110, an input/output (I/O) unit 1120, a memory device 1130, an interface unit 1140, and a data bus 1150. The memory device 1130 and the interface unit 1140 may communicate with each other through the data bus 1150.

The controller 1110 may include at least one of a microprocessor, a digital signal processor, a microcontroller, or other logic devices having a similar function to any one thereof. The memory device 1130 may store data processed by the controller 1110. The I/O unit 1120 may receive data or signals from an external system or may output data or signals to the external system. For example, the I/O unit 1120 may include at least one of a keypad, a keyboard, or a display device.

The memory device 1130 may include at least one of the non-volatile memory devices according to the aforementioned embodiments of the inventive concepts. Additionally, the memory device 1130 may further include at least one of another kind of a memory device, a random access volatile memory device, or other various kinds of memory devices.

The interface unit 1140 may transmit electrical data to a communication network or may receive electrical data from a communication network.

The non-volatile memory devices or the memory systems according to the inventive concepts may be encapsulated using various packaging techniques. For example, the non-volatile memory devices or the memory systems according to the inventive concepts may be encapsulated using any one of a package on package (PoP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

Figure 32:
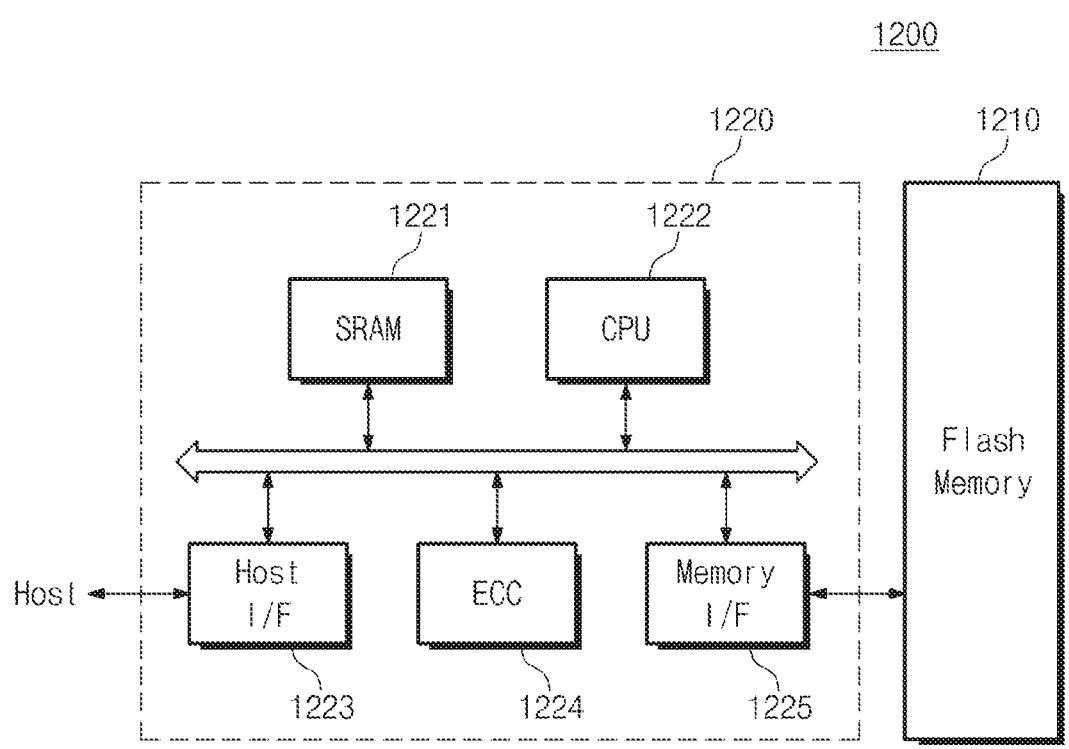
FIG. 32 is a schematic block diagram illustrating an example embodiment of a memory card including a non-volatile memory device according to example embodiments of the inventive concepts.

FIG. 32 is a schematic block diagram illustrating an example embodiment of a memory card including a non-volatile memory device according to embodiments of the inventive concepts.

Referring to FIG. 32, a memory card 1200 for storing massive data may include a flash memory device 1210. The flash memory device 1210 may include at least one of the non-volatile memory devices according to the above mentioned embodiments of the inventive concepts. The memory card 1200 may include a memory controller 1220 that controls data communication between a host and the flash memory device 1210.

A static random access memory (SRAM) device 1221 may be used as a working memory of a central processing unit (CPU) 1222. A host interface unit 1223 may be configured to include a data communication protocol between the memory card 1200 and the host. An error check and correction (ECC) block 1224 may detect and correct errors of data which are read out from the flash memory device 1210. A memory interface unit 1225 may interface with the flash memory device 1210 according to the inventive concepts. The CPU 1222 may perform overall operations for data communication of the memory controller 1220. Even though not shown in the drawings, the memory card 1200 may further include a read only memory (ROM) device that stores code data to interface with the host.

Figure 33:
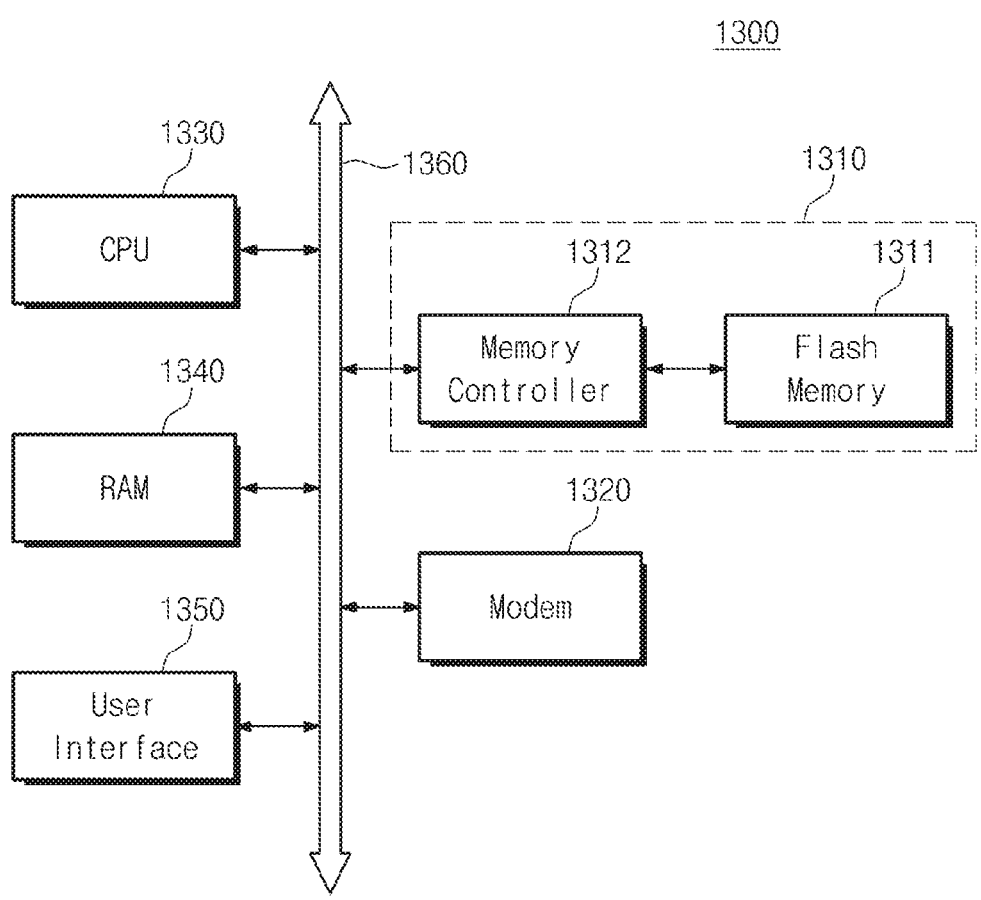
FIG. 33 is a schematic block diagram illustrating an example embodiment of an information processing system including a non-volatile memory device according to example embodiments of the inventive concepts.

FIG. 33 is a schematic block diagram illustrating an example embodiment of an information processing system including a non-volatile memory device according to embodiments of the inventive concepts.

Referring to FIG. 33, an information processing system 1300 according to the inventive concepts may include a modem 1320, a central processing unit (CPU) 1330, a random access memory (RAM) 1340, and a user interface unit 1350 which are electrically connected to a flash memory system 1310 through a system bus 1360. The flash memory system 1310 may be a substantially same as the memory card described above. For example, the flash memory system 1310 may include a flash memory device 1311 and a memory controller 1312. The memory controller 1312 may connect the flash memory device 1311 to the system bus 1360 to control data communication.

Data processed by the CPU 1330 and/or data inputted from an external system may be stored in the flash memory system 1310. Here, the flash memory system 1310 may be realized as a solid state disk (SSD) device. In this case, the information processing system 1300 may stably store massive data in the flash memory system 1310. In addition, as reliability of the flash memory system 1310 may increase, the flash memory system 1310 may reduce a resource consumed for correcting errors. Thus, the information processing system 1300 may perform high-speed data communication. Even though not shown in the drawings, an application chipset, a camera image processor (CIS), and an input/output unit may further be provided in the information processing system 1300.

According to the aforementioned embodiments of the inventive concepts, the charge storage layer may include the first charge storage layer, and the second and third charge storage layers spaced apart from each other with the first charge storage layer interposed therebetween. The energy band gap of the first charge storage layer may be smaller than those of the second and third charge storage layers, and the first charge storage layer may be thicker than the second and third charge storage layers. Thus, after the erase operation of the non-volatile memory device, the holes in the charge storage layer may be widely distributed at a low density along the valance band of the first charge storage layer. In this case, even though a long time elapses after the erase operation, the lateral spreading of the holes in the first charge storage layer may be minimized In other words, the increase of the residual holes in the charge storage layer may be minimized Thus, it is possible to minimize the loss of the electrons which may be caused by the residual holes of the charge storage layer.

In addition, the charge storage layer may further include the fourth and fifth charge storage layers which are spaced apart from each other with the first to third charge storage layers interposed therebetween. The energy band gaps of the fourth and fifth charge storage layers may be smaller than those of the second and third charge storage layers, respectively. In this case, a plurality of energy barriers may be generated in the charge storage layer, so it is possible to inhibit the electrons in the charge storage layer from moving to layers adjacent to the charge storage layer. In other words, the loss of the electrons of the charge storage layer may be minimized As a result, the charge retention characteristic and the reliability of the non-volatile memory device may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A non-volatile memory device comprising:
   a plurality of gate electrodes stacked on a substrate in a first direction perpendicular to a top surface of the substrate;
   a semiconductor pattern penetrating the gate electrodes and connected to the substrate; and
   a charge storage layer between the semiconductor pattern and the gate electrodes,
   wherein the charge storage layer comprises:
   a first charge storage layer disposed between the semiconductor pattern and the gate electrodes, the first charge storage layer having a first energy band gap;
   a second charge storage layer disposed between the first charge storage layer and the semiconductor pattern, the second charge storage layer having a second energy band gap; and
   a third charge storage layer disposed between the first charge storage layer and the gate electrodes, the third charge storage layer having a third energy band gap,
   wherein the first energy band gap is less than the second and third energy band gaps,
   wherein the first, second, and third charge storage layers have a first thickness, a second thickness, and a third thickness, respectively, in a second direction parallel to the top surface of the substrate, and
   wherein the first thickness is greater than the second thickness and the third thickness.

2. The non-volatile memory device of claim 1, further comprising:
   a tunnel insulating layer between the semiconductor pattern and the charge storage layer; and
   a blocking insulating layer between the charge storage layer and the gate electrodes,
   wherein the first, second, and third energy band gaps are less than respective energy band gaps of the tunnel insulating layer and the blocking insulating layer.

3. The non-volatile memory device of claim 2, wherein a nitrogen concentration in the first charge storage layer is greater than a nitrogen concentration in the second charge storage layer and a nitrogen concentration in the third charge storage layer.

4. The non-volatile memory device of claim 3, wherein an oxygen concentration in the first charge storage layer is less than an oxygen concentration in the second charge storage layer and an oxygen concentration in the third charge storage layer.

5. The non-volatile memory device of claim 2, wherein the charge storage layer further comprises a fourth charge storage layer disposed between the second charge storage layer and the tunnel insulating layer,
   wherein the fourth charge storage layer has a fourth energy band gap, and
   wherein the fourth energy band gap is smaller than the second energy band gap.

6. The non-volatile memory device of claim 5, wherein the fourth charge storage layer has a fourth thickness in the second direction, and
   wherein the fourth thickness is equal to or less than the second thickness.

7. The non-volatile memory device of claim 5, wherein a nitrogen concentration in the fourth charge storage layer is greater than a nitrogen concentration in the second charge storage layer.

8. The non-volatile memory device of claim 7, wherein an oxygen concentration in the fourth charge storage layer is less than an oxygen concentration in the second charge storage layer.

9. The non-volatile memory device of claim 5, wherein the charge storage layer further comprises a fifth charge storage layer disposed between the third charge storage layer and the blocking insulating layer,
   wherein the fifth charge storage layer has a fifth energy band gap, and
   wherein the fifth energy band gap is less than the third energy band gap.

10. The non-volatile memory device of claim 9, wherein the fifth charge storage layer has a fifth thickness in the second direction, and
    wherein the fifth thickness is equal to or less than the third thickness.

11. The non-volatile memory device of claim 9, wherein a nitrogen concentration in the fifth charge storage layer is greater than a nitrogen concentration in the third charge storage layer.

12. The non-volatile memory device of claim 11, wherein an oxygen concentration in the fifth charge storage layer is less than an oxygen concentration in the third charge storage layer.

13. A non-volatile memory device comprising:
    a gate electrode on a top surface of a semiconductor substrate; and
    a charge storage layer between the semiconductor substrate and the gate electrode,
    wherein the charge storage layer comprises:
    a first charge storage layer disposed between the semiconductor substrate and the gate electrode, the first charge storage layer having a first energy band gap;
    a second charge storage layer disposed between the first charge storage layer and the semiconductor substrate, the second charge storage layer having a second energy band gap; and
    a third charge storage layer disposed between the first charge storage layer and the gate electrode, the third charge storage layer having a third energy band gap,
    wherein the first energy band gap is less than the second and third energy band gaps,
    wherein the first, second, and third charge storage layers have a first thickness, a second thickness, and a third thickness, respectively, in a direction perpendicular to the top surface of the semiconductor substrate,
    wherein the first thickness is greater than the second thickness and the third thickness, and wherein a nitrogen concentration in the first charge storage layer is greater than a nitrogen concentration in the second charge storage layer and a nitrogen concentration in the third charge storage layer.

14. The non-volatile memory device of claim 13, further comprising:
a tunnel insulating layer between the semiconductor substrate and the charge storage layer; and
a blocking insulating layer between the charge storage layer and the gate electrode,
wherein the first, second, and third energy band gaps are less than energy band gaps of the tunnel insulating layer and the blocking insulating layer.

15. The non-volatile memory device of claim 13, wherein an oxygen concentration in the first charge storage layer is less than an oxygen concentration in the second charge storage layer and an oxygen concentration in the third charge storage layer.

16. A non-volatile memory device comprising:
a gate electrode on a top surface of a semiconductor substrate; and
a charge storage layer between the semiconductor substrate and the gate electrode,
wherein the charge storage layer comprises:
a first charge storage layer disposed between the semiconductor substrate and the gate electrode, the first charge storage layer having a first energy band gap;
a second charge storage layer disposed between the first charge storage layer and the semiconductor substrate, the second charge storage layer having a second energy band gap;
a third charge storage layer disposed between the first charge storage layer and the gate electrode, the third charge storage layer having a third energy band gap;
a tunnel insulating layer between the semiconductor substrate and the charge storage layer; and
a blocking insulating layer between the charge storage layer and the gate electrode
wherein the first energy band gap is less than the second and third energy band gaps,
wherein the first, second, and third charge storage layers have a first thickness, a second thickness, and a third thickness, respectively, in a direction perpendicular to the top surface of the semiconductor substrate,
wherein the first thickness is greater than the second thickness and the third thickness,
wherein the charge storage layer further comprises a fourth charge storage layer disposed between the second charge storage layer and the tunnel insulating layer,
wherein the fourth charge storage layer has a fourth energy band gap, and
wherein the fourth energy band gap is less than the second energy band gap.

17. The non-volatile memory device of claim 16, wherein the fourth charge storage layer has a fourth thickness in the direction perpendicular to the top surface of the semiconductor substrate, and
wherein the fourth thickness is equal to or less than the second thickness.

18. The non-volatile memory device of claim 16, wherein the charge storage layer further comprises a fifth charge storage layer disposed between the third charge storage layer and the blocking insulating layer,
wherein the fifth charge storage layer has a fifth energy band gap, and
wherein the fifth energy band gap is less than the third energy band gap.

19. The non-volatile memory device of claim 18, wherein the fifth charge storage layer has a fifth thickness in the direction perpendicular to the top surface of the semiconductor substrate, and
wherein the fifth thickness is equal to or less than the third thickness.

* * * * *